US006800428B2

(12) United States Patent
Okada et al.

(10) Patent No.: US 6,800,428 B2
(45) Date of Patent: Oct. 5, 2004

(54) WAVELENGTH-INDEPENDENT EXPOSURE PATTERN GENERATION METHOD AND EXPOSURE PATTERN GENERATION SYSTEM FOR LITHOGRAPHY

(75) Inventors: Tomoyuki Okada, Kawasaki (JP); Taketoshi Omata, Kawasaki (JP); Kazuya Sugawa, Kawasaki (JP); Kiyokazu Aiso, Kawasaki (JP); Masao Sugiyama, Kawasaki (JP); Tomoaki Kawaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 189 days.

(21) Appl. No.: 10/133,590

(22) Filed: Apr. 29, 2002

(65) Prior Publication Data

US 2003/0087193 A1 May 8, 2003

(30) Foreign Application Priority Data

Nov. 8, 2001 (JP) .......................... 2001-343615

(51) Int. Cl.[7] .............. G03F 7/00; G03F 9/00
(52) U.S. Cl. ............ 430/394; 430/5; 430/30; 430/396; 716/19; 716/20; 716/21
(58) Field of Search ................ 430/394, 396, 430/5, 30; 716/19–21

(56) References Cited

U.S. PATENT DOCUMENTS

| 4,895,780 A | * | 1/1990 | Nissan-Cohen et al. | ....... 430/5 |
| 5,905,020 A | * | 5/1999 | Hu et al. | ............ 430/394 |
| 6,243,855 B1 | * | 6/2001 | Kobayashi et al. | .......... 716/19 |

OTHER PUBLICATIONS

S.Pau et al.: "Wavelength Independent Optical Lithography"; Jl. Vac.Sc. and Tech. B, v18,(2000), pp 317–320.*

* cited by examiner

Primary Examiner—Mark F. Huff
Assistant Examiner—Kripa Sagar
(74) Attorney, Agent, or Firm—Staas & Halsey LLP

(57) ABSTRACT

A method of generating an exposure pattern for lithography to create a plurality of patterns arranged in a predetermined direction, comprises a step of counting the plurality of patterns along this predetermined direction, and generating a first enlarged pattern by moving the edges to a first direction along the predetermined direction for a pattern with an odd number, and by moving the edges to a second direction, which is opposite to the first direction, for a pattern with an even number, and a step of generating a second enlarged pattern by moving the edges to the second direction for the pattern with an odd number, and by moving the edges to the first direction for the pattern with an even number. And the first and second patterns are used for creating the plurality of original patterns in a lithography step using the respective enlarged patterns.

18 Claims, 22 Drawing Sheets

PRIOR ART

EXPOSURE

DEVELOPMENT

ETCHING

PRIOR ART
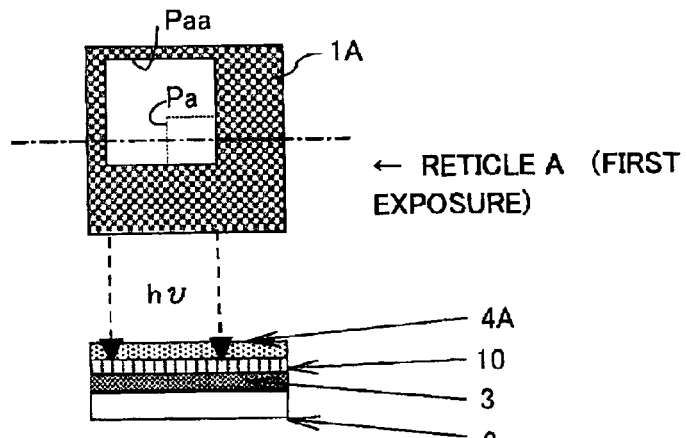
FIG. 2A
EXPOSURE (1)
FIG. 2B
DEVELOPMENT
FIG. 2C
ETCHING
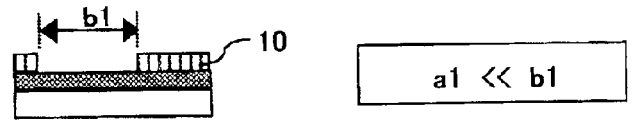
$a1 \ll b1$
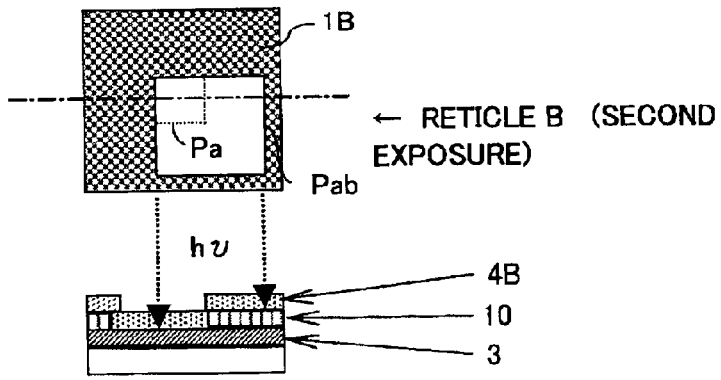
FIG. 2D
EXPOSURE (2)
FIG. 2E
DEVELOPMENT
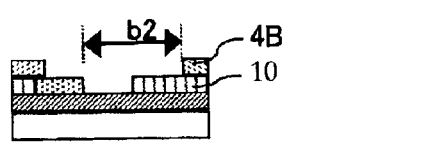
FIG. 2F
ETCHING
$a1 \ll b2$

RETICLE A

RETICLE B

RETICLE A → RETICLE B

RETICLE A PATTERN GENERATION METHOD

RETICLE B PATTERN GENERATION METHOD

[ BEFORE EDGE MOVEMENT ]

HEADER
FIELD1:ADD=1
PATTERN_DATA_START
ADD1
REC,(1,1),W2,H8
REC,(8,1),W2,H8
PATTERN_DATA_END
DATA_END

[ AFTER EDGE MOVEMENT ]

HEADER
FIELD1:ADD=1
PATTERN_DATA_START
ADD1
REC,(1,1),W3,H8
REC,(7,1),W3,H8
PATTERN_DATA_END
DATA_END

PATTERN DATA (DB1)

OUTLINE OF PATTERN IS RECOGNIZED (S16)

BLOCK OF PATTERNS

PATTERN SEPARATION (S18)

SEPARATED PATTERN DATA (CROSS PATTERN EXAMPLE)

COUNT (S20)

PATTERN DATA CLASSIFIED INTO ODD OR EVEN

ERROR PATTERN GENERATION

ERROR PATTERN REMOVAL METHOD

METHOD OF GENERATING RETICLE A, B FOR DIAGONAL PATTERN

(1) ORIGNAL PATTERN (0,0)  SEARCH START (2) PATTERN GENERATION FOR RETICLE A (3) PATTERN OF RETICLE A (1) PATTERN GENERATION FOR RETICLE B (2) PATTERN OF RETICLE B (3) COMPOSITE PATTERN OF RETICLES A, B

WAVELENGTH-INDEPENDENT EXPOSURE PATTERN GENERATION METHOD AND EXPOSURE PATTERN GENERATION SYSTEM FOR LITHOGRAPHY

BACKGROUND OF THE INVENTION

1. Field of the Invention

The present invention relates to a method of generating and a system of generating an exposure pattern for a lithography process used for semiconductors, liquid crystal substrates and printed boards, and more particularly to an exposure pattern generation method and an exposure pattern generation system which allows creating micro-patterns by a low technology stepper machine, such as an i-line, using a plurality of reticles or mask substrates.

2. Description of the Related Art

As the size of semiconductor devices decreases and precision thereof increases, micro-patterns must be created on a wafer at a required precision to satisfy the device characteristics. Therefore a reduction in size and an increase in precision are demanded for a photo mask (hereafter reticle) used in the wafer exposure process as well. Methods to create micro-patterns on a wafer at high precision are diversifying, and the price of reticles and the cost of aligners are increasing accordingly.

As a method of creating conventional micro-patterns (e.g. a 200 nm or less design rule), performing OPC processing (Optical Proximity Correction), where the exposure pattern is corrected considering the proximity exposure effect when the design data is converted to the format of the electron beam aligner to create exposure pattern data, and generating patterns by a stepper machine with a KrF excimer laser beam (248 nm) or an ArF excimer laser beam (193 nm) using a phase shift mask, have been proposed.

However, such conventional methods are not sufficient solutions since the data processing for OPC processing takes time, the cost of phase shift masks is high, and a stepper machine with a KrF or ArF excimer laser beam must be newly installed.

As a lithography method which allows the generation of micro-patterns using a conventionally popular i-line (365 nm) stepper machine, creating micro-patterns by a plurality of times of the lithography steps using a plurality of (e.g. two) reticles, has been proposed. For example, "wavelength-independent optical lithography" in J. Vac. Sci, Technol. B 18 (1), January/February 2000, discloses creating micro-patterns, executing exposure, developing and etching twice using two reticles, and creating micro-patterns by the composite pattern of these two reticles.

FIGS. 1A to 1C are diagrams depicting a conventional general lithography step. This lithography step comprises an exposure process (FIG. 1A) where light hv is irradiated onto a resist layer 4 coated on the patterning target layer 3 of the wafer substrate 2 using the reticle 1 which has the light transmission hole Pa, a resist development step (FIG. 1B), and an etching step using the resist as a mask (FIG. 1C). When the light transmission hole Pa becomes very small, the resist 4 cannot be developed to be a shape with the same pattern width a1 as the light transmission hole Pa. This is because light is out-of-focus, and resist cannot be finely processed by a stepper using such a long wavelength light as an i-line. As a result, the final pattern 6 to be created on the patterning target layer 3 tends to have a pattern width smaller than the pattern width a1 of the reticle 1.

FIGS. 2A to 2F are diagrams depicting the wavelength-independent lithography step which is proposed by the above mentioned article. In this lithography step, exposure, development and etching are performing with a reticle A, which has a pattern Paa when a micro-pattern Pa is enlarged in a first direction, and a reticle B, which has a pattern Pab when the micro-pattern Pa is enlarged in a second direction respectively, so that the micro-pattern Pa is created by a composite of the reticles A and B. In exposure using the reticle 1 having the micro-pattern Pa, the resist cannot be patterned accurately because the long wavelength light, such as visible light, is out-of-focus, but in the case of exposure using the reticles A and B, which have patterns when the micro-pattern Pa is enlarged respectively, the resist can be patterned accurately even with long wavelength light.

As FIG. 2A shows, a protective layer 10, such as oxide film, and a resist 4A, are created on the pattern target layer 3 on the wafer 2, and in the first exposure, the first reticle 1A, which has a pattern Paa when the processing target pattern Pa is enlarged to the upper left direction, is used for exposure (FIG. 2A). And this resist 4A is developed and the resist 4A is patterned. Since the transmission hole Paa is not a micro-pattern, light does not become out-of-focus during exposure, and the pattern Paa can be transferred onto the resist 4A accurately. The protective layer 10 is etched using this resist 4A as a mask (FIG. 2C). The width b1 of the pattern created on the protective layer 10 is sufficiently larger than the width a1 of the processing target pattern Pa.

Then the resist 4B is created on the protective layer 10 again, and a second exposure is executed. In the second exposure, the second reticle 1B, which has a pattern Pab when the processing target pattern Pa is enlarged to the lower right direction, is used for exposure (FIG. 2D). When the resist 4B is developed and the resist 4B is patterned, the pattern becomes a pattern which partially overlaps with the pattern on the protective layer 10, created after the first exposure step (FIG. 2E). This pattern width b2 is also sufficiently larger than the width a1 of the processing target pattern PA. Finally, using the pattern of the protective layer 10 and the pattern of the resist 4B as a mask, the patterning target layer 3 is etched (FIG. 2F). As a result, the processing target pattern Pa is created on the patterning target layer 3 by a composite pattern, where the enlarged pattern Paa of the reticle 1A and the enlarged pattern Pab of the reticle 1B are overlapped.

FIGS. 3A and 3B are diagrams depicting the generation methods for two reticle patterns to be used for the lithography step shown in FIG. 2. As FIG. 3A shows, the pattern of the reticle A, which is the first reticle, is an enlarged pattern Paa, where the left edge and the top edge of the processing target pattern Pa are extended. And as FIG. 3B shows, the pattern of the reticle B, which is the second reticle, is an enlarged pattern Pab, where the right edge and the bottom edge of the processing target pattern Pa are extended. The composite pattern where the patterns Paa and Pab of the reticles A and B overlap becomes the processing target pattern Pa.

Exposure and development are executed using the two reticles which have enlarged patterns, so a micro-pattern can be created using an i-line-based low technology stepper machine. However, the exposure, development and etching steps must be executed twice.

FIGS. 4A to 4C are diagrams depicting a problem of the above mentioned lithography method. This example is the case when the above mentioned lithography method is applied to four micro-patterns Pa, Pb, Pc and Pd, which are longer in the longitudinal direction, wherein the patterns Pb and Pc, out of the four micro-patterns, are close to each other. In the case of a micro-pattern which is longer in the vertical direction, the pattern of the reticle A becomes the enlarged patterns Paa, Pba, Pca and Pda, where the left edges are extended, as shown in FIG. 4A, and the pattern of the reticle B becomes the enlarged patterns Pab, Pbb, Pcb and Pdb, where the right edges are extended, as shown in FIG. 4B.

In this case, the gray patterns where both patterns overlap in FIG. 4 become the processing target micro-patterns Pa, Pb, Pc and Pd, but since the patterns Pb and Pc are close to each other, the enlarged patterns Pca and Pbb of these patterns partially overlap, and the finally created patterns include the error pattern Px, which is created between the micro-patterns Pb and Pc, as FIG. 4C shows.

To prevent the generation of this error pattern Px, the degree of enlargement when the reticles A and B are created is decreased, but then, the enlarged patterns become similar to the original micro-patterns, and the pattern accuracy drops because light is out-of-focus during exposure.

FIGS. 5A and 5B are diagrams depicting another problem of the above mentioned lithography method. This example shows the case when an L-shaped micro-pattern is created. As FIG. 5A shows, the L-shaped micro-pattern is comprised of two rectangular patterns Pa and Pb. For these two rectangular patterns Pa and Pb, the reticle A, which has enlarged patterns Paa and Pba when the patterns Pa and Pb are extended to the upper left direction, and the reticle B, which has the enlarged patterns Pab and Pbb when the patterns Pa and Pb are extended to the lower right direction, are generated, and a composite pattern is generated by both reticles. The composite result is shown in FIG. 5B. In other words, the area where the enlarged pattern of the reticle A, shown by the solid line, and the enlarged pattern of the reticle B, shown by the dashed line, overlap (double exposure area), is created in the final pattern. A multiple exposure area is generated at the area Px, which the original micro-pattern does not have, which becomes the error pattern Px.

As described above, in the case of the method of creating a micro-pattern by multiple exposure using two enlarged patterns, a multiple exposure area is created in an unexpected area when the micro-patterns are close to each other, or when the micro-patterns are bent, such as in an L-shape, where an error pattern is created.

SUMMARY OF THE INVENTION

With the foregoing in view, it is an object of the present invention to provide an exposure pattern generation method and an exposure pattern generation system for lithography which can solve the above problems and prevent the generation of an unexpected multiple exposure area.

To achieve the above object, the first aspect of the present invention is a method of generating an exposure pattern for lithography to create a plurality of patterns arranged in a predetermined direction, comprising a step of counting the plurality of patterns along this predetermined direction, and generating a first enlarged pattern by moving the edges to a first direction along the predetermined direction for a pattern with an odd number, and by moving the edges to a second direction, which is opposite to the first direction, for a pattern with an even number, and a step of generating a second enlarged pattern by moving the edges to the second direction for the pattern with an odd number, and by moving the edges to the first direction for the pattern with an even number. And the first and second patterns are used for creating the plurality of original patterns in a lithography step using the respective enlarged patterns.

In this method, the direction of moving the edges of adjacent patterns for generating an enlarged pattern is opposite from each other. By this, overlapping of the first enlarged pattern and the second enlarged pattern in an area, which the original pattern does not have, is prevented, and therefore the generation of an error pattern is prevented.

To achieve the above object, the second aspect of the present invention is a method of generating an exposure pattern for lithography to create an L-shaped pattern combined by a plurality of rectangular patterns, comprising a step of generating a first enlarged pattern by moving the edges of the L-shaped pattern to the external angle direction of the L-shaped pattern, and a step of generating a second enlarged pattern by moving the above mentioned edges to the internal angle direction of the L-shaped pattern. The first and second enlarged patterns are used for creating an original L-shaped pattern in the lithography processing using the respective enlarged patterns.

According to this method, in the case of the L-shaped pattern, which is bent and has an internal angle and an external angle, the direction of moving the edges of the plurality of rectangular patterns constituting the L-shaped pattern is the external angle direction for the first enlarged pattern, and the internal angle direction for the second enlarged pattern. As a result, a multiple exposure area where the first and second enlarged patterns overlap will not be produced in any place but in the original L-shaped pattern.

To achieve the above object, the third aspect of the present invention is a method of generating an exposure pattern for lithography to create a cross-pattern, such a cross-shaped pattern, comprising a step of separating the cross-pattern into an L-shaped pattern and a rectangular pattern, a step of generating a first enlarged pattern by moving the edges of the L-shaped pattern to the external angle direction, and moving the edges of another rectangular pattern connected to the L-shaped pattern to a direction the opposite of the external angle direction, and a step of generating a second enlarged pattern by moving the edges of the L-shaped pattern to the internal angle direction, and moving the edges of another rectangular pattern connected to the L-shaped pattern to a direction the opposite of the internal direction. And the first and second enlarged patterns are used for creating an original cross-pattern in the lithography step using the respective enlarged patterns.

According to this method, an error pattern is not generated for the L-shaped pattern, and also the direction of moving the edges of the rectangular pattern, which is adjacent to the L-shaped pattern and forms the internal angle and the external angle with the L-shaped pattern, is set to a direction the opposite of the direction of moving the edges of the L-shaped pattern, so the generation of an error pattern at a position crossing the L-shaped pattern and the rectangular pattern is prevented.

To achieve the above object, a fourth aspect of the present invention is a method of generating an exposure pattern for lithography to create a plurality of patterns, comprising a step of generating a first enlarged pattern by moving the edges of the original pattern to a first direction, a step of generating a second enlarged pattern by moving the edges of the original pattern to a second direction which is the opposite of the first direction, an AND processing step of executing AND processing of the first and second enlarged patterns and generating an AND pattern having an area where both the enlarged patterns overlap, an exclusive processing step of executing an exclusive OR processing of the original pattern and the AND pattern, and generating an exclusive pattern having an exclusive area of the original pattern and the AND pattern, and a removal processing step of generating a new first enlarged pattern by removing the exclusive pattern from the first enlarged pattern.

According to the above method, even if a multiple exposure area, which the original pattern does not have, is generated by the lithography method using the first and second enlarged patterns, the generation of an incorrect multiple exposure area is prevented by predicting such a multiple exposure area, and removing the area from the first or second enlarged patterns.

BRIEF DESCRIPTION OF THE DRAWINGS

FIGS. 2A to 2F are diagrams depicting a light wavelength-independent lithography process;

DESCRIPTION OF THE PREFERRED EMBODIMENTS

Embodiments of the present invention will now be described with reference to the accompanying drawings. The scope of the protection of the present invention, however, is not restricted by the following embodiments, but extends to the invention stated in the Claims and equivalents thereof.

Figure 6A:
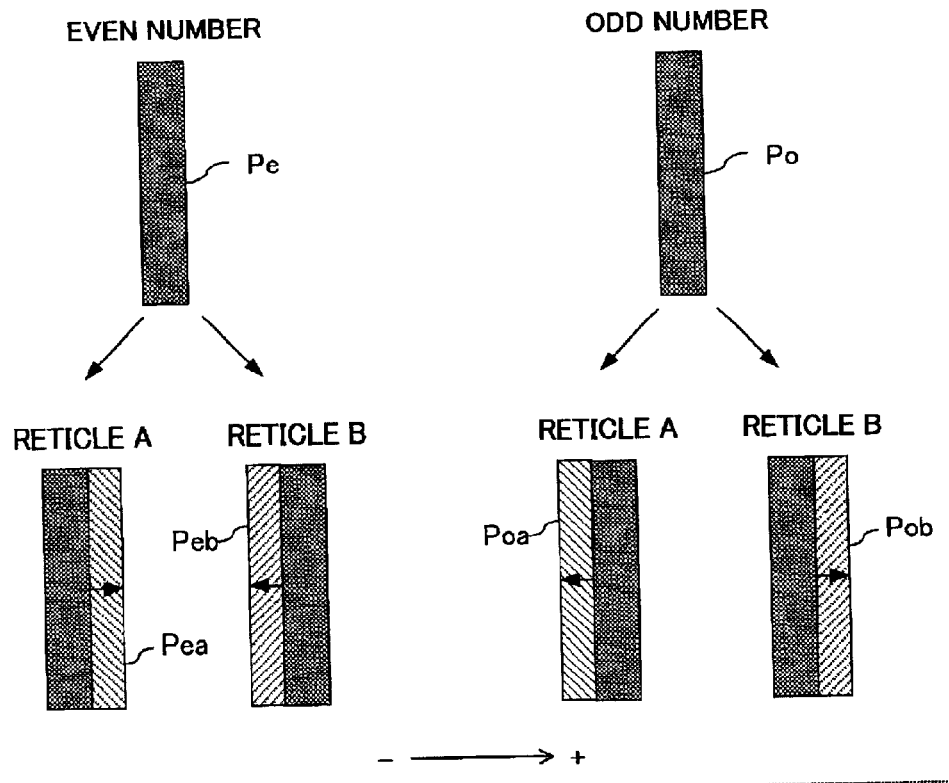
FIGS. 6A and 6B are diagrams depicting a creation method for reticles A and B with rectangular patterns in the present embodiment.
Figure 6B:
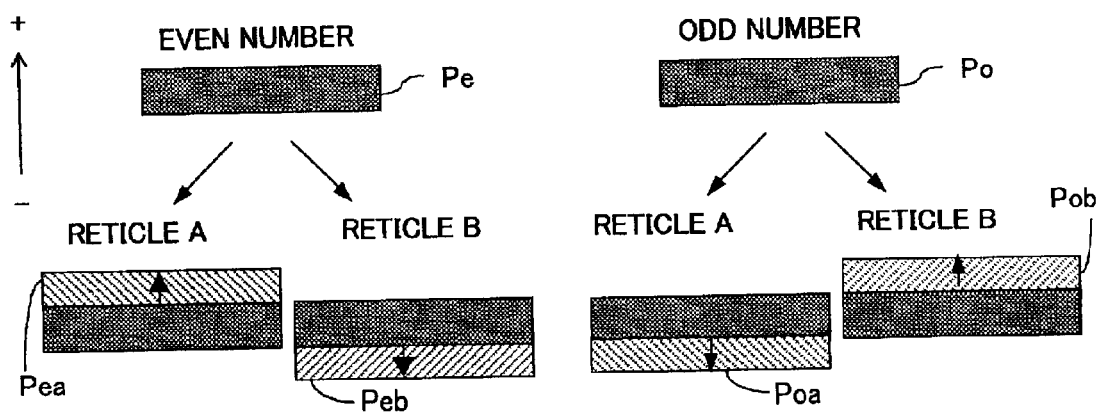

FIGS. 6A and 6B are diagrams depicting a creation method for reticles A and B having rectangular patterns in the present embodiment. In the present embodiment, a first enlarged pattern and a second enlarged pattern are generated from the original pattern, but to simplify description, the first enlarged pattern is called "reticle A", and the second enlarged patterns is called "reticle B".

To prevent the generation of an error pattern between the adjacent patterns shown in FIG. 4, the present embodiment sets the edge moving direction of the adjacent rectangular patterns, out of a plurality of rectangular patterns which are arranged in a predetermined direction, to be the opposite of each other. For this, the number of the rectangular patterns which are arranged in a predetermined direction is counted, and the rectangular patterns are separated into even number patterns and odd number patterns. And the edge moving direction of the rectangular patterns with an even number and the edge moving direction of the rectangular patterns with an odd number are set to be the opposite.

FIG. 6A shows a generation method for reticles A and B with vertical rectangular patterns. For the rectangular pattern Pe with an even number, the right edge is moved to the plus direction (right direction in FIG. 6A) to create the pattern Pea of the reticle A, and the left edge is moved in the minus direction (left direction in FIG. 6A) to create the pattern Peb of the reticle B. For the rectangular pattern Po with an odd number, the left edge is moved to the minus direction to create the pattern Poa of the reticle A, and the right edge is moved to the plus direction to create the pattern Pob of the reticle B.

FIG. 6B shows a generation method for reticles A and B for horizontal rectangular patterns. For the rectangular pattern Pe with an even number, the top edge is moved to the plus direction (top direction in FIG. 6B) to create the pattern Pea of the reticle A, and the bottom edge is moved to the minus direction (bottom direction in FIG. 6B) to create the pattern Peb of the reticle B. For the rectangular pattern Po with an odd number, the bottom edge is moved to the minus direction to create the pattern Poa of the reticle A, and the top edge is moved to the plus direction to create the pattern Pob of the reticle B.

Figure 7A:
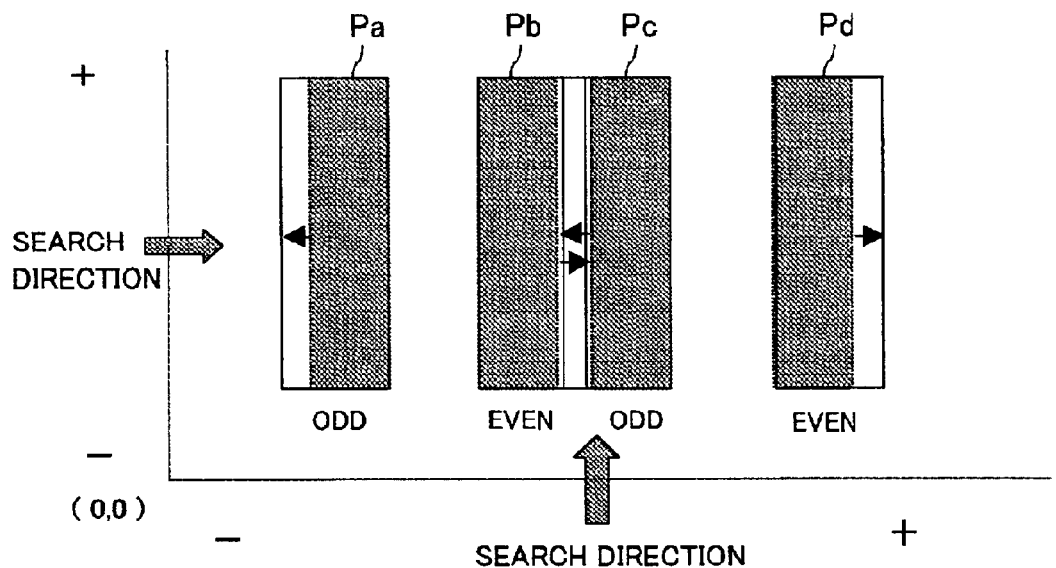
FIGS. 7A and 7B are diagrams depicting a generation method for reticles A and B with vertical rectangular patterns in the present embodiment.
Figure 7B:
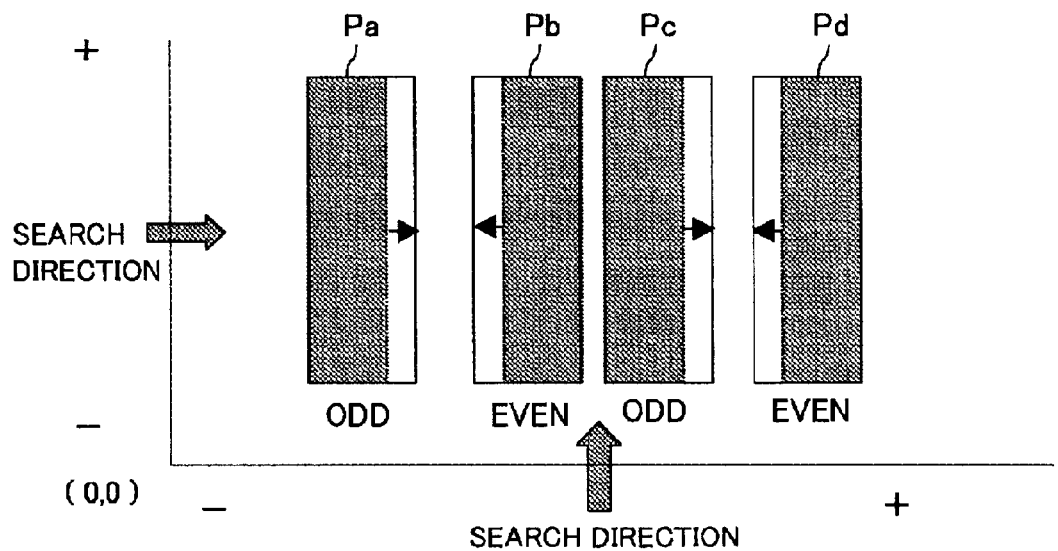

FIGS. 7A and 7B are diagrams depicting a generation method for reticles A and B with vertical rectangular patterns. FIGS. 7A and 7B are examples when the generation method FIGS. 6A and 6B are applied to the four rectangular patterns Pa, Pb, Pc and Pd in FIGS. 4A to 4C. The four vertical rectangular patterns are arranged in the lateral direction, and the rectangular patterns are counted in the lateral direction, that is the plus direction, from the search origin (0, 0) for detecting the odd number or the even number of each rectangular pattern, then the patterns Pa and Pc are the odd patterns, and the patterns Pb and Pd are the even patterns.

Figure 1A:
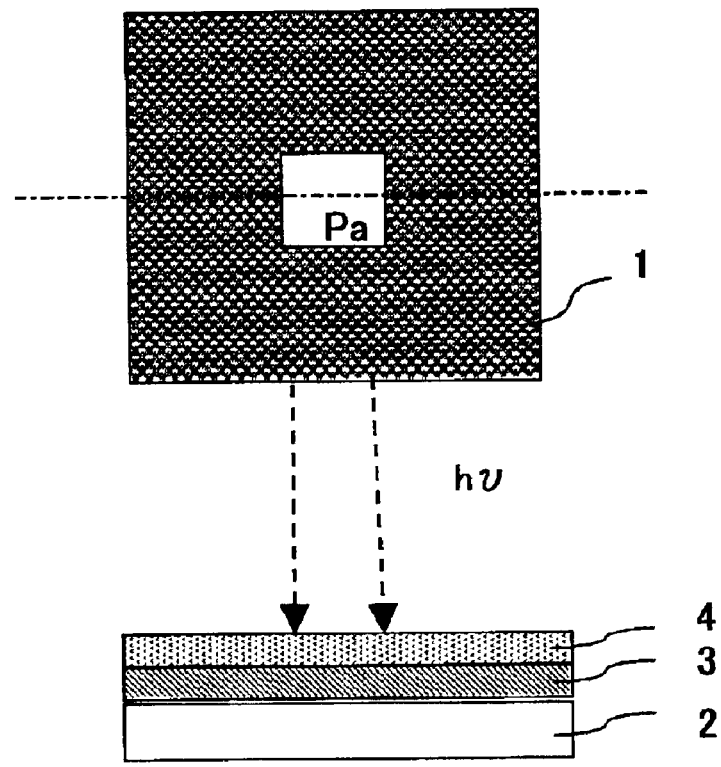
FIGS. 1A to 1C are diagrams depicting a conventional general lithography process.
Figure 1B:
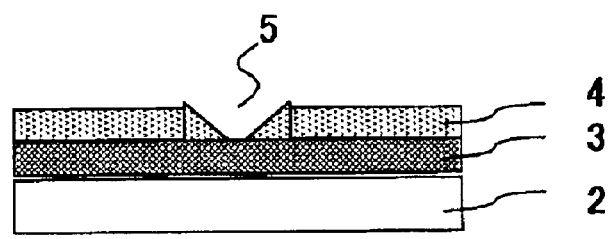
Figure 1C:
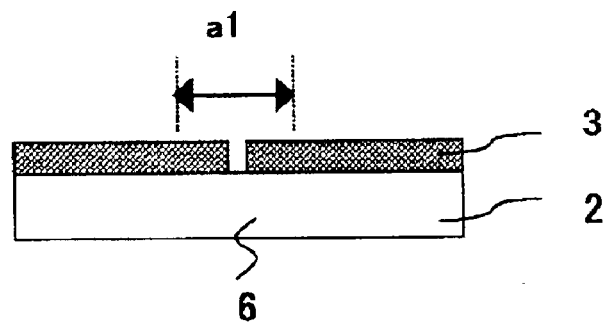
Figure 3A:
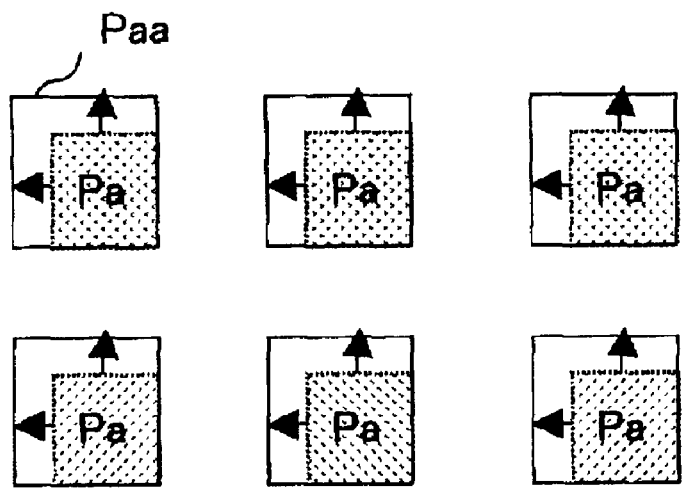
FIGS. 3A to 3B are diagrams depicting a generation method for two reticle patterns to be used for the lithography process shown in FIG. 2.
Figure 3B:
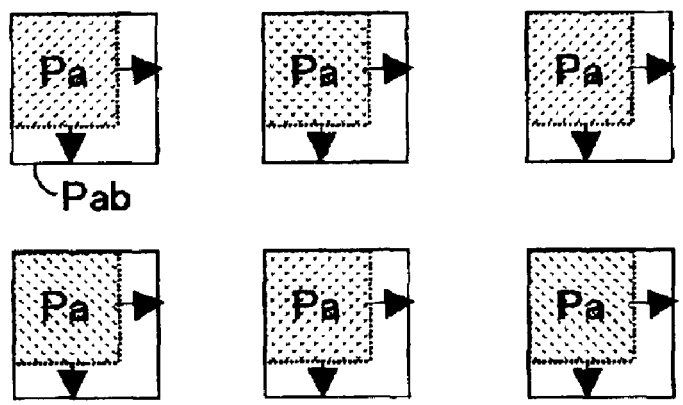

FIGS. 7A and 1B show the search origin (0, 0), the horizontal search direction, and the vertical search direction.

For the vertical rectangular patterns which are arranged in the horizontal direction, an odd pattern and an even pattern are detected by searching in the horizontal direction from the search origin. For the horizontal rectangular patterns which are arranged in the vertical direction, an odd pattern and an even pattern are detected by searching in the vertical direction from the search origin, although this is not illustrated.

So by applying the algorithm in FIGS. 6A and 6B, the extended patterns, where the left edges of the odd patterns Pa and Pc are moved to the minus direction, and the extended patterns, where the right edges of the even patterns Pb and Pd are moved to the plus direction, are generated to create the patterns of the reticle A, as shown in FIG. 7A. And the extended patterns, where the right edges of the odd patterns Pa and Pc are moved to the plus direction, and the extended patterns, where the left edges of the even patterns Pb and Pd are moved to the minus direction, are generated to create the patterns of reticle B, as FIG. 7B shows.

Figure 4A:
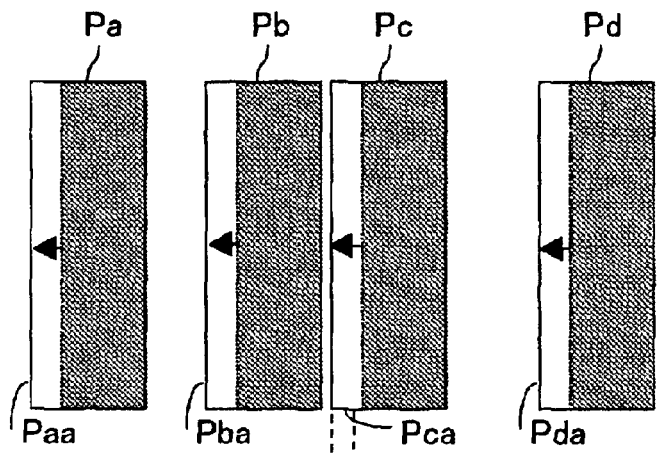
FIGS. 4A to 4C are diagrams depicting a problem of lithography.
Figure 4B:
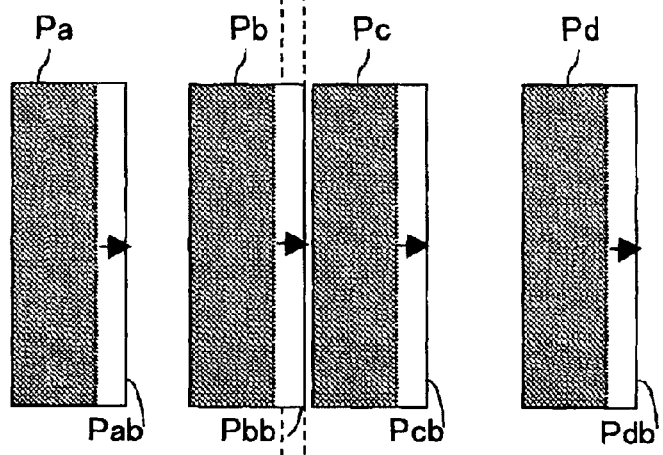
Figure 4C:
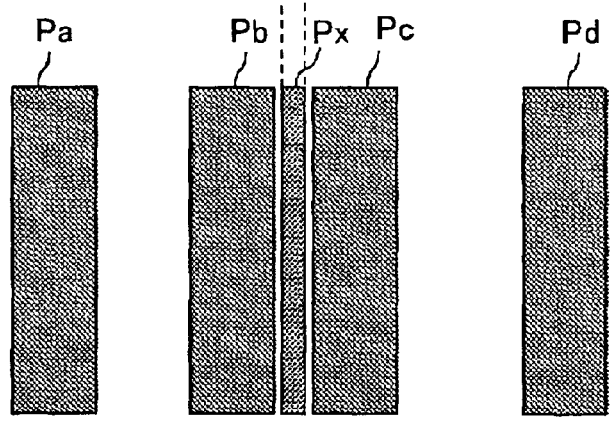

Just like FIGS. 4A to 4C, the distance between the patterns Pb and Pc, out of the four rectangular patterns in FIGS. 7A and 7B, is relatively small. However, the extending directions of the adjacent rectangular patterns Pb and Pc are the opposite of each other, so the extended pattern is created for the reticle A in the area between the adjacent patterns Pb and Pc, but the extended pattern is not created for the reticle B. Therefore the patterns on the reticle A and reticle B do not overlap in the area between the adjacent patterns Pb and Pc, where multiple exposure is not executed.

Figure 8:
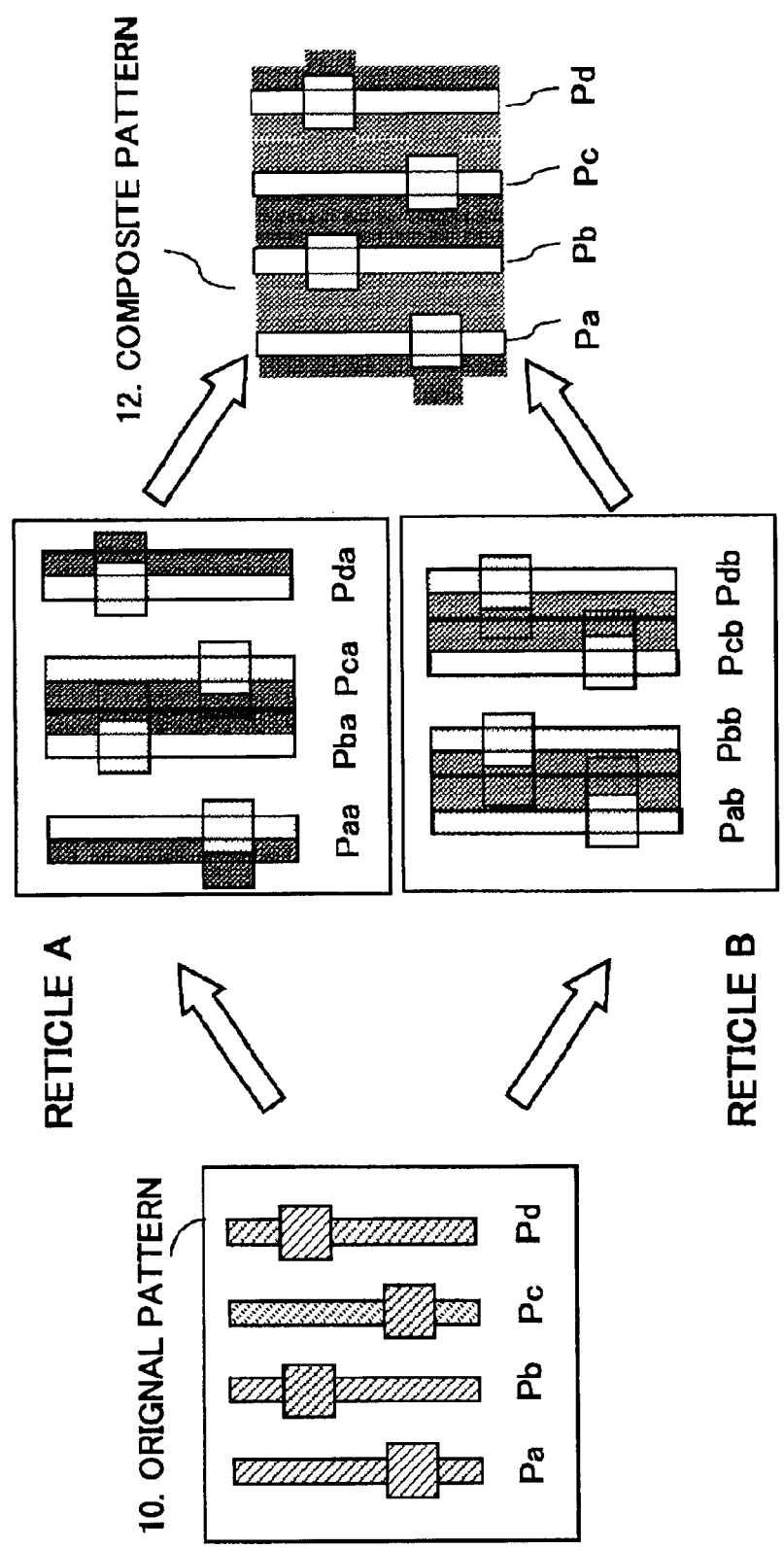
FIG. 8 is a diagram depicting a pattern after composition when the exposure pattern generation method for rectangular patterns is used.

FIG. 8 is a diagram depicting a pattern after composition when the exposure pattern generation method for the above rectangular patterns is used. Assume that the original pattern 10 is comprised of the vertical rectangular patterns Pa, Pb, Pc and Pd, as illustrated. Each pattern has a part where the width is wider than the rest of the area. Counting from the left, the patterns Pa and Pc are odd patterns, and the patterns Pb and Pd are even patterns. The exposure pattern of the reticle A is comprised of the extended patterns Paa, Pba, Pca and Pda, and the exposure pattern of the reticle B is comprised of the extended patterns Pab, Pbb, Pcb and Pdb. When exposure, development and etching are executed using the reticle A, and exposure, development and etching are executed again using the reticle B, the composite pattern 12 is generated, as illustrated. In other words, the white patterns of the composite pattern 12 are reproduced as the original patterns Pa, Pb, Pc and Pd.

As FIG. 8 shows, the reticle A defines the right side contour for the odd patterns Pa and Pc, and the left side contour for the even patterns Pb and Pd. The reticle B defines the left side contour for the odd patterns Pa and Pc, and the right side contour for the even patterns Pb and Pd. The composite pattern is an area which is multiple-exposed by the reticles A and B, where the contours at the left and right of the respective pattern are defined. No multiple exposed area exists between the patterns, so no error pattern is generated.

Figure 9:
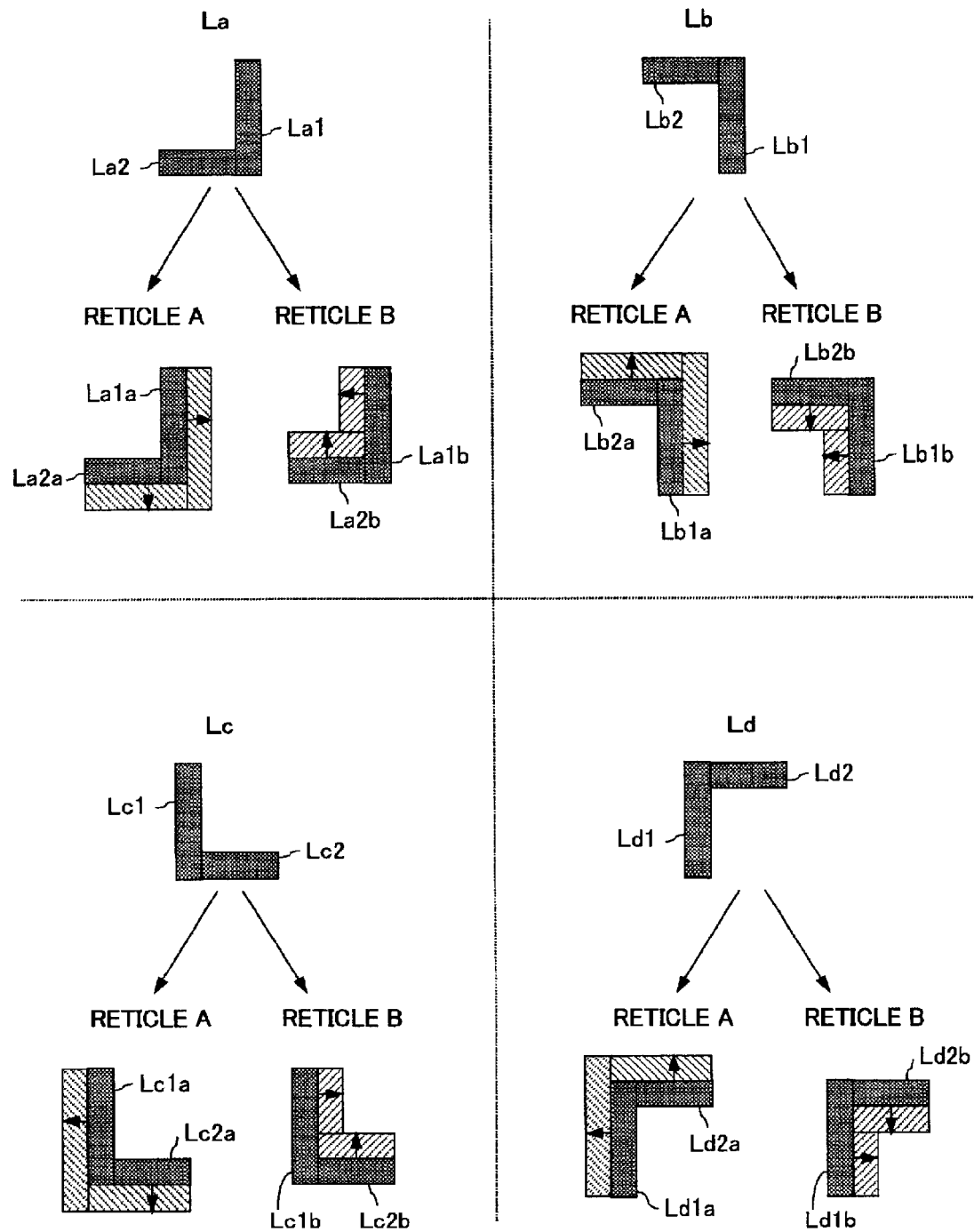
FIG. 9 are diagrams depicting an exposure pattern creation method for L-shaped patterns in the present embodiment.

FIG. 9 are diagrams depicting an exposure pattern creation method for L-shaped patterns. As FIG. 9 shows, the L-shaped patterns are the four types of patterns La, Lb, Lc and Ld, each having different directions.

The L-shaped pattern La is a 9:00 pattern, which is comprised of a vertical rectangular pattern La1 and a horizontal rectangular pattern La2. In this case, the reticle A is generated by extending the edges at the external angle side of the L-shape. In other words, the right edge of the vertical rectangular pattern La1 is moved to the right side, and the bottom edge of the horizontal rectangular pattern La2 is moved to the bottom side, so as to generate the extended patterns La1a and La2a. The reticle B is generated by extending the edges at the internal angle side of the L-shape. In other words, the left edge of the vertical rectangular pattern La1 is moved to the left side, and the top edge of the horizontal rectangular pattern La2 is moved to the top side, so as to generate the extended patterns La1b and La2b.

Figure 5A:
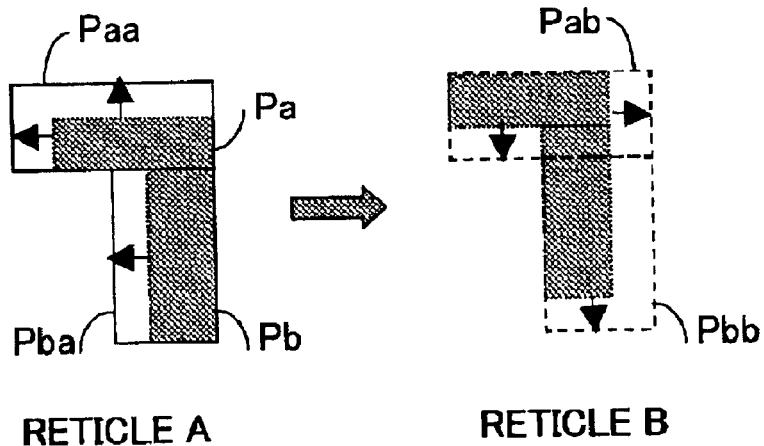
FIGS. 5A and 5B are diagrams depicting another problem of lithography.
Figure 5B:
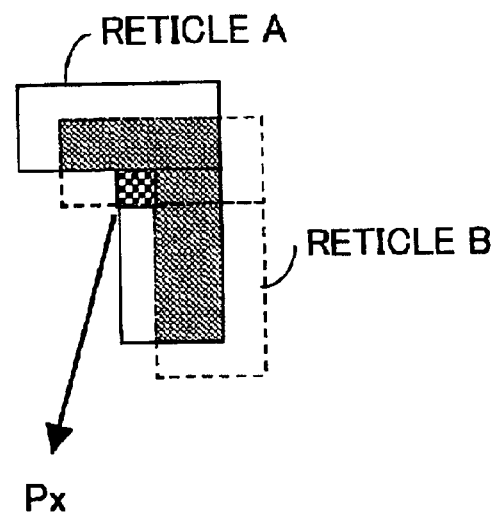

The multiple exposure area composed of reticles A and B is the area which has only the original patterns La1 and La2, and the generation of the error pattern shown in FIG. 5 is prevented.

The L-shaped pattern Lb is a pattern similar to a 9:30 pattern, which is comprised of a vertical rectangular pattern Lb1 and a horizontal rectangular pattern Lb2. In this case as well, the exposure pattern of the reticle A is generated by extending the edges at the external angle side of the L-shape, and the exposure pattern of the reticle B is generated by extending the edges at the internal angle side of the L-shape.

The L-shaped pattern Lc is a 3:00 pattern, and the L-shaped pattern Ld is a pattern similar to a 3:30 pattern. Each pattern is comprised of a vertical pattern and a horizontal pattern respectively, where the exposure pattern of the reticle A is generated by extending the edges at the external angle side of the L-shape, and the exposure pattern of the reticle B is generated by extending the edges at the internal angle side of the L-shape.

In any case, the multiple exposure area, which is composed of the reticles A and B, is the area which has only the original patterns, and generation of the error pattern shown in FIG. 5 is prevented.

Figure 10:
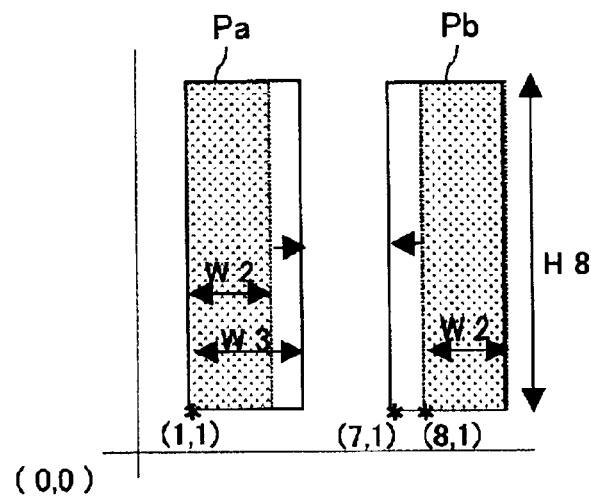
FIG. 10 is a diagram depicting the pattern data when edges of a pattern are moved.

FIG. 10 is a diagram depicting pattern data when an edge of a pattern is moved. A rectangular pattern is normally expressed by pattern data which has the coordinates of the lower left vertex, pattern width W and pattern height H. Assume that the right edge of the pattern Pa moves to the right direction, and the left edge of the pattern Pb moves to the left direction to generate the respective extended pattern.

The pattern data "REC, (1,1), W2, H8" of the pattern Pa is changed to "REC, (1,1), W3, H8", and the pattern data Pb of the pattern "REC, (8,1), W2, H8" is changed to "REC, (7,1), W3, H8", so as to be an extended pattern of the reticle A. In other words, in moving the right edge of the pattern Pa to the right, the pattern width W is changed, and in moving the left edge of the pattern Pb to the left, the pattern vertex coordinates and the pattern width W are changed, so as to generate the pattern data of an extended pattern.

Figure 11A:
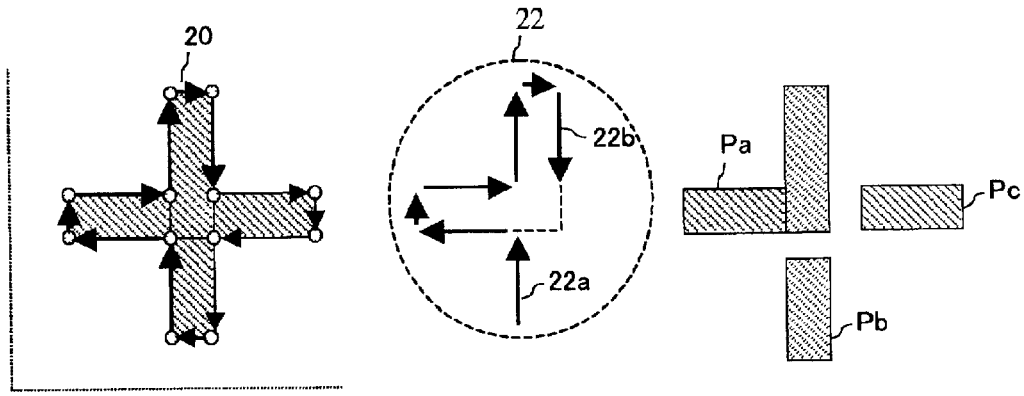
FIGS. 11A to 11C are diagrams depicting the algorithm for separating a cross-platform into rectangles and L-shaped patterns.
Figure 11B:
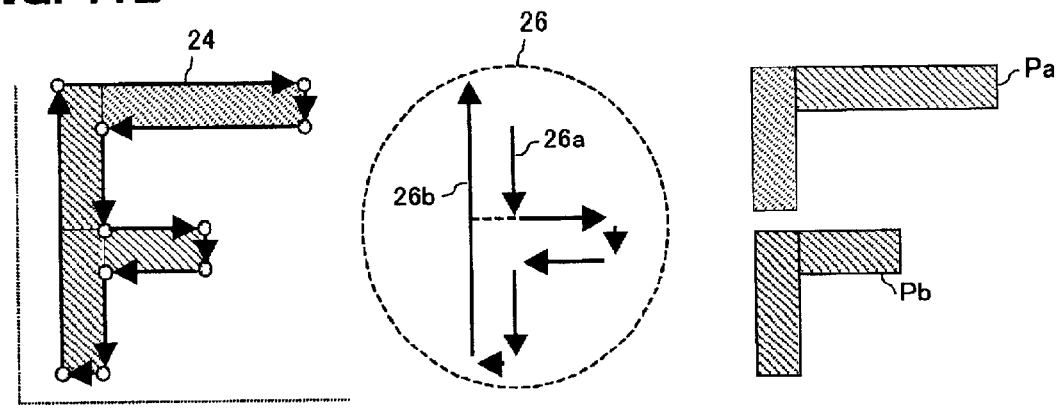
Figure 11C:
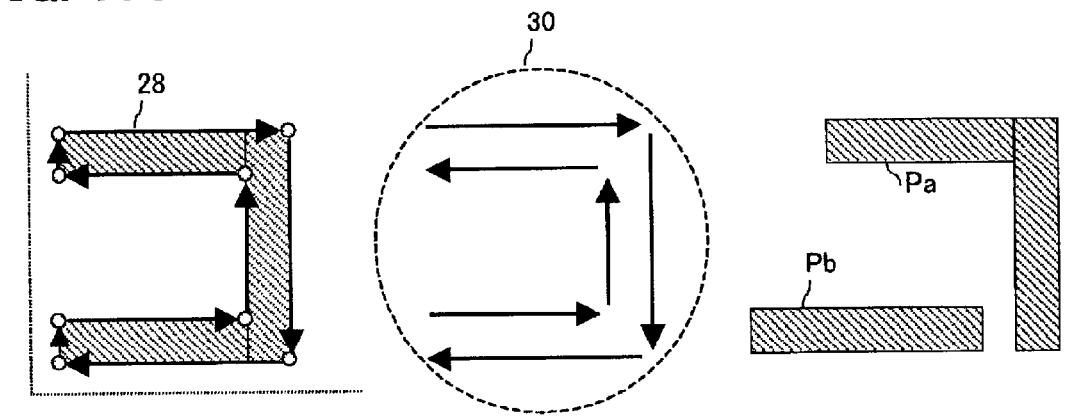

FIGS. 11A to 11C are diagrams depicting the algorithm for separating a cross-pattern into rectangular and L-shaped patterns. Other than rectangular and L-shaped patterns, cross-patterns, which are combinations of rectangular and L-shaped patterns, such as a cross-shaped pattern, F-shaped pattern and angular C-shaped pattern, exist in LSI patterns. A cross-pattern can be separated into rectangular patterns and L-shaped patterns. Therefore in the present embodiment, a cross-pattern is detected and separated into rectangular patterns and L-shaped patterns, and the generation of an error pattern is prevented by adjusting the edge extension direction of the rectangular patterns and the separated-rectangular patterns.

FIG. 11A shows an example of a cross-shaped pattern. A cross-shaped pattern is comprised of four rectangular pattern data, but in the separation algorithm of the present embodiment, the cross-shaped block pattern 20 is detected by generating vectors connecting the pattern vertexes. Then it is checked whether the shape of the vectors 20 matches the reference vector group 22, and if there is a match, the cross-shaped pattern is separated into the L-shaped pattern Pa and two rectangular patterns Pb and Pc connected thereto. The reference vector group 22 is characterized in that an extra vector 22a is included, in addition to the vectors between the vertexes of the L-shape. By checking for the existence of this extra vector 22a and the vector 22b, the L-shaped pattern can be distinguished from the later mentioned F-shaped pattern.

FIG. 11B shows an example of an F-shaped pattern. An F-shaped pattern is comprised of the two L-shaped patterns Pa and Pb. In this case as well, a block pattern is detected from the vectors 24 connecting the pattern vertexes. If the vectors 24 match the reference vector group 26, the L-shaped pattern Pb is separated. From the vector shape connecting the vertexes of the remaining pattern, another L-shaped pattern Pa is detected. This reference group 26 has the vectors 26a and 26b, which can be distinguished from the vectors 22a and 22b of the reference vector 22 of the cross-shaped pattern.

FIG. 11C shows an example of an angular C-shaped pattern. The angular C-shaped pattern is comprised of one L-shaped pattern Pa and one rectangular pattern Pb. In this case as well, an angular C-shaped block pattern is detected from the vector 28 connecting the pattern vertex, and if the vector matches the reference vector group 30, the pattern is separated into the L-shaped pattern Pa and the rectangular pattern Pb.

Figure 12A:
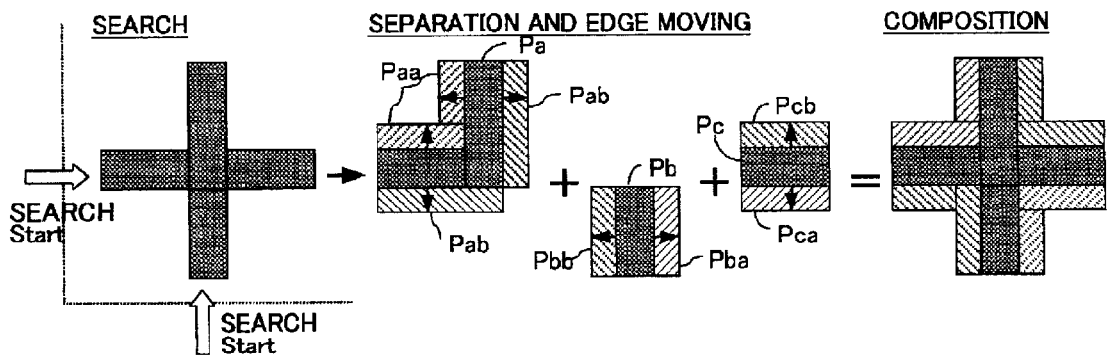
FIGS. 12A to 12C are diagrams depicting reticle generation algorithm for a cross-pattern in the present embodiment.
Figure 12B:
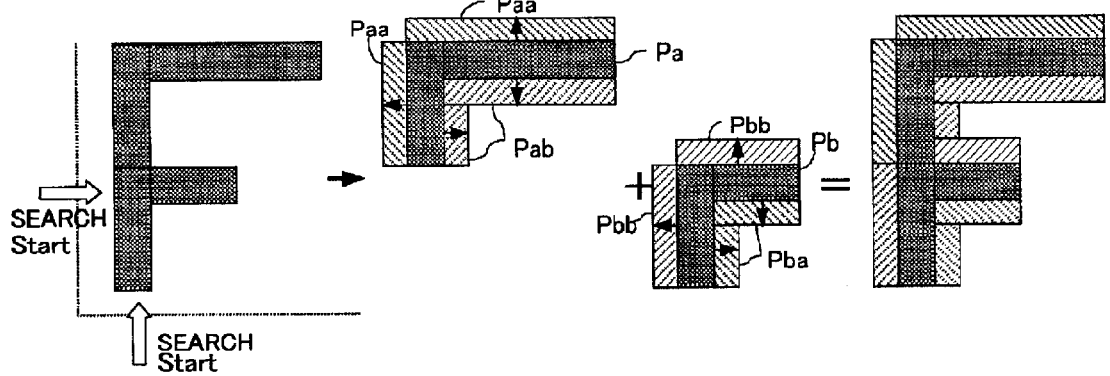
Figure 12C:
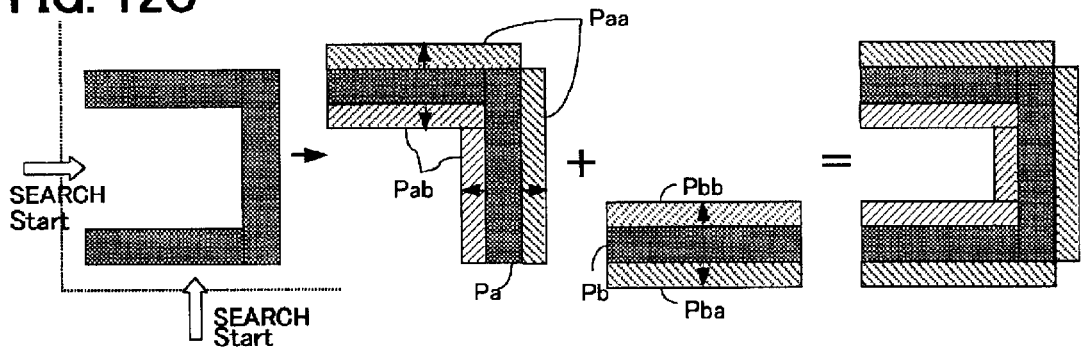

FIGS. 12A to 12C are diagrams depicting the reticle generation algorithm for cross-patterns in the present embodiment. FIG. 12A shows the reticle generation algorithm for the cross-shaped pattern. As FIG. 11 shows, the cross-shaped pattern 20 is separated into the L-shaped pattern Pa and the two rectangular patterns Pb and Pc. When an extended pattern Paa is generated by extending the L-shaped pattern Pa in the internal angle direction for the pattern of the reticle A, the extended pattern Pba is generated by moving the right edge to the right for the rectangular pattern Pb connected to the L-shaped pattern Pa, and the extended pattern Pca is generated for the rectangular pattern Pc by moving the bottom edge downward. In this way, edges are extended for rectangular patterns in a direction the opposite of the internal angle direction of the L-shaped pattern Pa.

When the extended pattern Pab is generated by extending the L-shaped pattern Pa in the external angle direction for the pattern of the reticle B, the extended pattern Pbb is generated for the rectangular pattern Pb by moving the left edge to the left, and the extended pattern Pcb is generated for the rectangular pattern Pc by moving the top edge upward. In other words, for the rectangular patterns Pb and Pc, edges are extended to a direction the opposite of the external angle direction of the L-shaped pattern Pa.

In this way, the edge moving direction of the rectangular pattern is determined according to the edge moving direction of the L-shaped pattern connected thereto. As a result, the generation of an error pattern in the internal angle area, as shown in FIG. 5, can be prevented between the L-shaped pattern Pa and the rectangular F patterns Pb and Pc, which are connected to and generate the internal angle area with the L-shaped pattern Pa. In the case of the example in FIG. 12A, the generation of an error pattern in the internal angle area with the rectangular patterns Pb and Pc is also prevented.

Reticles A and B for cross-shaped patterns can also be generated by deciding the edge moving directions of the other rectangular patterns and the L-shaped pattern based on the edge moving direction of a rectangular pattern. For example, when the extended pattern Pba of the rectangular pattern Pb is generated by moving the right edge to the right for generating the reticle A, the extended pattern Pbb is generated by moving the left edge thereof to the left for generating the reticle B. Along with this, it is decided that the edge moving to the external angle direction of the L-shaped pattern Pa is used for generating the reticle B, and the edge moving to the internal angle direction is used for generating the reticle A. For generating reticle A for the rectangular pattern Pc, which crosses the rectangular pattern Pb, it is decided that the extended pattern Pca is generated by moving the bottom edge, corresponding to the internal angle direction of these rectangular patterns, downward, and for generating the reticle B, the extended pattern Pcb is generated by moving the top edge, corresponding to the external angle direction thereof, upward.

FIG. 12B shows the reticle generation algorithm for an F-shaped pattern. As described in FIG. 11, the F-shaped pattern is separated into two L-shaped patterns. When an extended pattern Paa is generated by moving the edge to the external angle direction for generating the reticle A for the first L-shaped pattern Pa, the extended pattern Pba is generated by moving the edges to the internal angle direction with respect to the second L-shaped pattern Pb, which has a pattern crossing the first L-shaped pattern Pa. Along with this, the extended pattern Pab is generated by moving the edges to the internal angle direction with respect to the first L-shaped pattern Pa, and the extended pattern Pbb is generated by moving the edges to the external angle direction with respect to the second L-shaped pattern Pb for generating the reticle B. As a result, the generation of an error pattern shown in FIG. 4 in the internal angle area formed by the first and second L-shaped patterns Pa and Pb is prevented.

FIG. 12C shows the reticle generation algorithm for an angular C-shaped pattern. As described in FIG. 11, the angular C-shaped pattern is separated into an L-shaped pattern Pa and a rectangular pattern Pb. When an extended pattern Paa is generated by moving the edge of the L-shaped pattern Pa to the external angle direction for generating the reticle A, the extended pattern Pba is generated by moving the bottom edge of the rectangular pattern Pb downward. For generating the reticle B, the extended pattern Pab is generated by moving the edges of the L-shaped pattern Pb to the internal angle direction, and the extended pattern Pbb is generated by moving the top edge of the rectangular pattern Pb upward.

In the angular C-shaped pattern as well, the edge extending direction of the L-shaped pattern may be decided according to the algorithm used for generating the reticles A and B with rectangular patterns. In any case, the extended patterns of the L-shaped pattern are generated by moving the edges to the external angle direction and to the internal angle direction, so no error pattern is generated in the internal angle area of the L-shaped pattern. Therefore, the edge moving directions of the L-shaped pattern and the rectangular pattern are decided so that an error pattern, shown in FIG. 5, is not generated in the internal angle area formed by the L-shaped pattern and the rectangular pattern.

Figure 13:
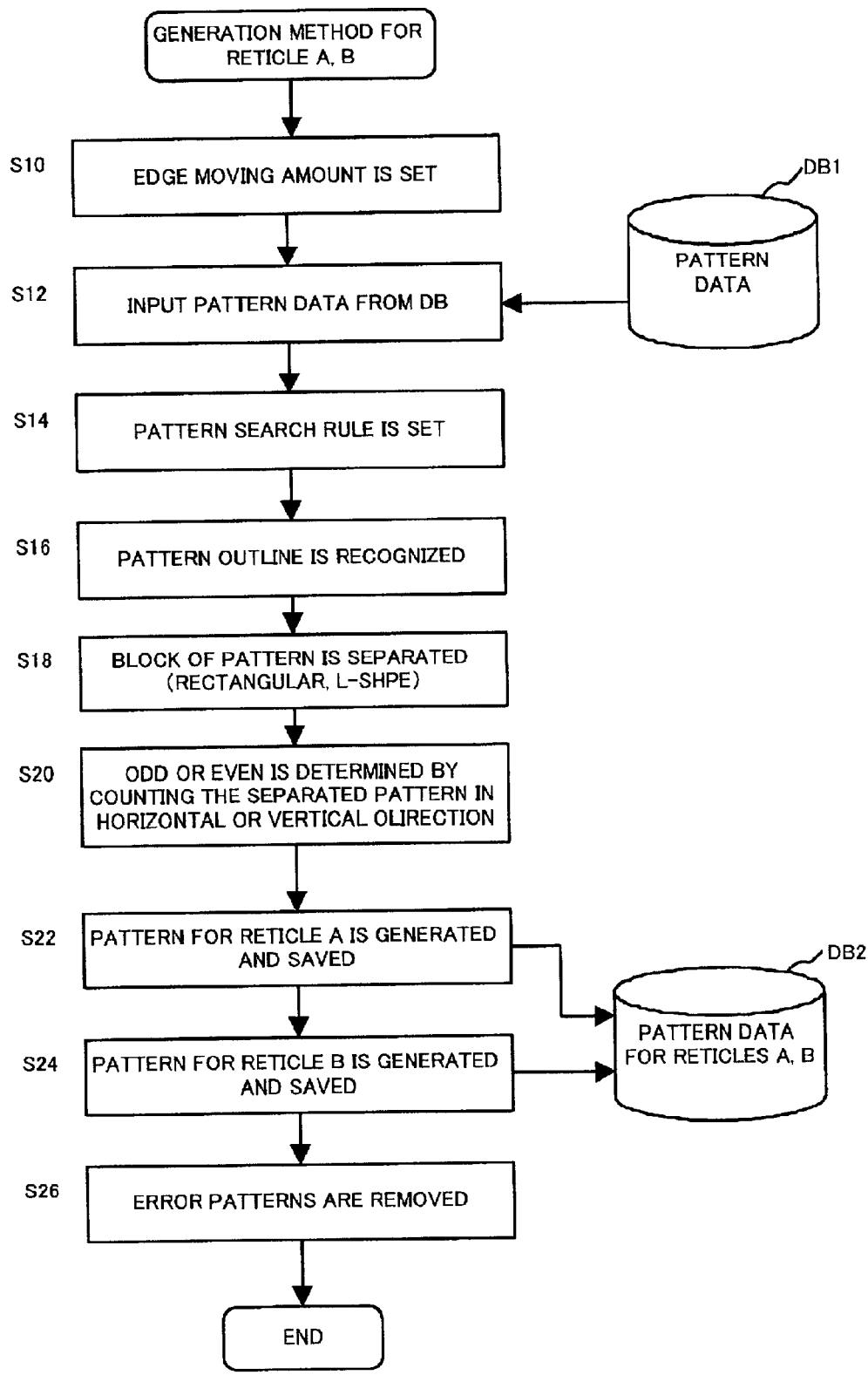
FIG. 13 is a flow chart depicting an exposure pattern data generation method in the present embodiment.

FIG. 13 is a flow chart depicting an exposure pattern data generation method in the present embodiment. From the pattern data DB1 generated by computer design, the exposure pattern data DB2 of the reticles A and B for generating a micro-pattern thereof is generated.

Initially the edge moving amount is set as the initial setting (S10). According to the precision and the density of the micro-pattern, an optimum edge moving amount is set. If the edge moving amount is too large, an unexpected multiple exposure area is generated, and if the edge moving amount is too small, a micro-pattern cannot be created at high precision. Therefore an optimum edge moving amount is set considering both conditions.

Then the pattern data is input (S12). And for the plurality of pattern data which is input, the pattern search rule is set (S14). In other words, as described in FIG. 7, the search origin and the search direction are set.

Figure 14:
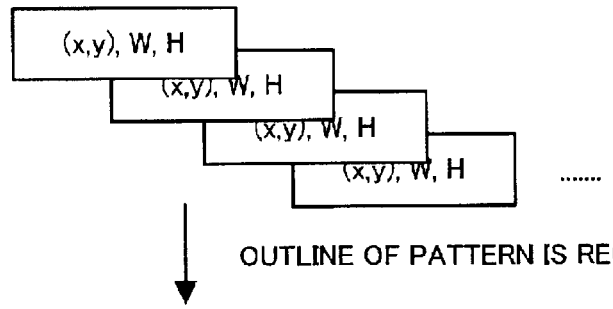
FIG. 14 is a diagram depicting a pattern data configuration example.
Figure 14:
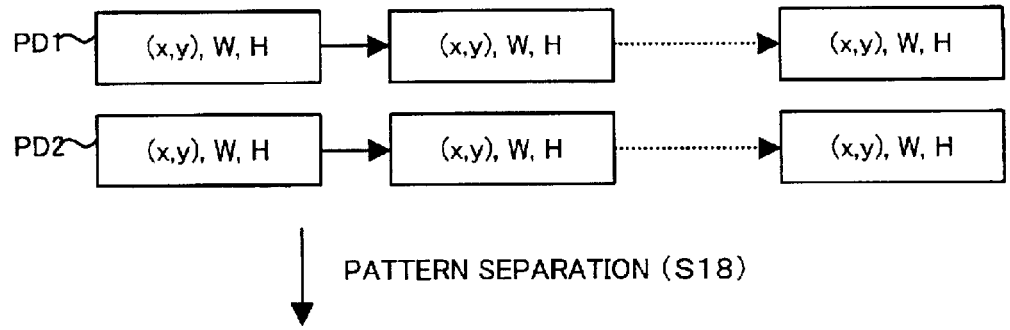
Figure 14:
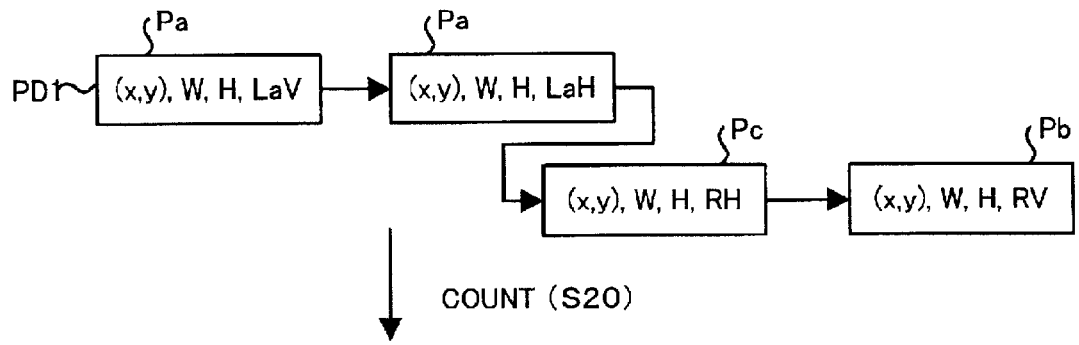
Figure 14:
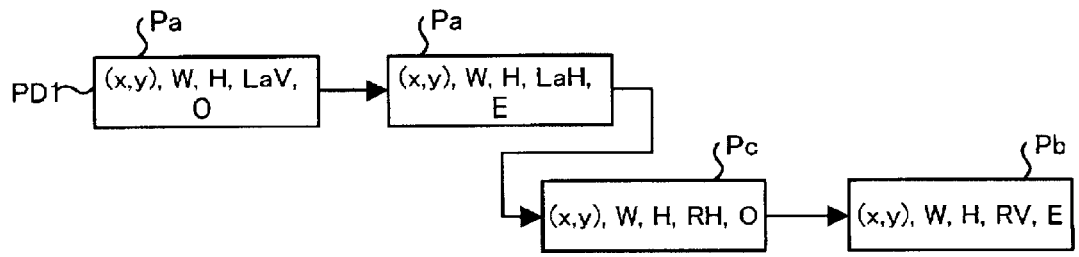

FIG. 14 are diagrams depicting a pattern data configuration example. As described in FIG. 10, a pattern data is comprised of lower left vertex coordinates (x, y), pattern width W and pattern height H. In Step S12, a plurality of pattern data is input from the pattern database DB1 in FIG. 14.

Then the outline of the pattern is recognized (S16). In this step, vectors connecting the vertexes of the pattern are generated, and a block of the patterns is recognized when the plurality of vectors return to the starting point. In the example in FIG. 14, the block pattern data PD1 and PD2 are comprised of a set of a plurality of pattern data respectively.

A rectangular pattern is separated into a predetermined length in the horizontal direction and the vertical direction. A cross-pattern is separated into an L-shaped pattern and a rectangular pattern based on the algorithm described in FIG. 11. As a result, the pattern is separated into a plurality of rectangular patterns and L-shaped patterns (S18). FIG. 14 shows an example when the cross-shaped block pattern PD1 is separated into an L-shaped pattern Pa in a direction the same as a 9:00 pattern (attribute data La), a horizontal rectangular pattern Pc (attribute data RH), and a vertical rectangular pattern Pb (attribute data RV). The L-shaped pattern Pa is separated into a vertical rectangular pattern (attribute data LaV), and a horizontal rectangular pattern (attribute data LaH).

Then the separated patterns are counted in the horizontal direction and the vertical direction according to the searching rule, so as to determine the odd patterns and the even patterns (S20). In the case of FIG. 14, four patterns separated from the cross-shaped pattern are classified into odd patterns (O) and even patterns (E).

In this way, attribute data is assigned to the separated pattern data, such as whether the pattern data constitutes a same block data, whether it constitutes an L-shaped pattern (LaV, LaH), whether it is a horizontal rectangular pattern (RH) or a vertical rectangular pattern (VH), and whether it is an odd pattern (O) or an even pattern (E).

In this state, edges are moved for each rectangular pattern, and the pattern of the reticle A is generated and saved (S22), and the pattern of the reticle B is generated and saved (S24), so as to generate the respective extended pattern data DB2 of the reticles A and B.

The generated patterns of the reticles A and B here are exposure pattern data which have been converted into a format compatible to the aligner. Therefore the reticles A and B can be created respectively by inputting this reticle pattern data DB2 to the aligner. The lithography method using the reticles A and B is shown in FIG. 2.

After generating the patterns of the reticles A and B, an error pattern is removed from the reticles A or B assuming the case of the generation of an unexpected error pattern (S26). This error pattern removal method will be described later.

Figure 15:
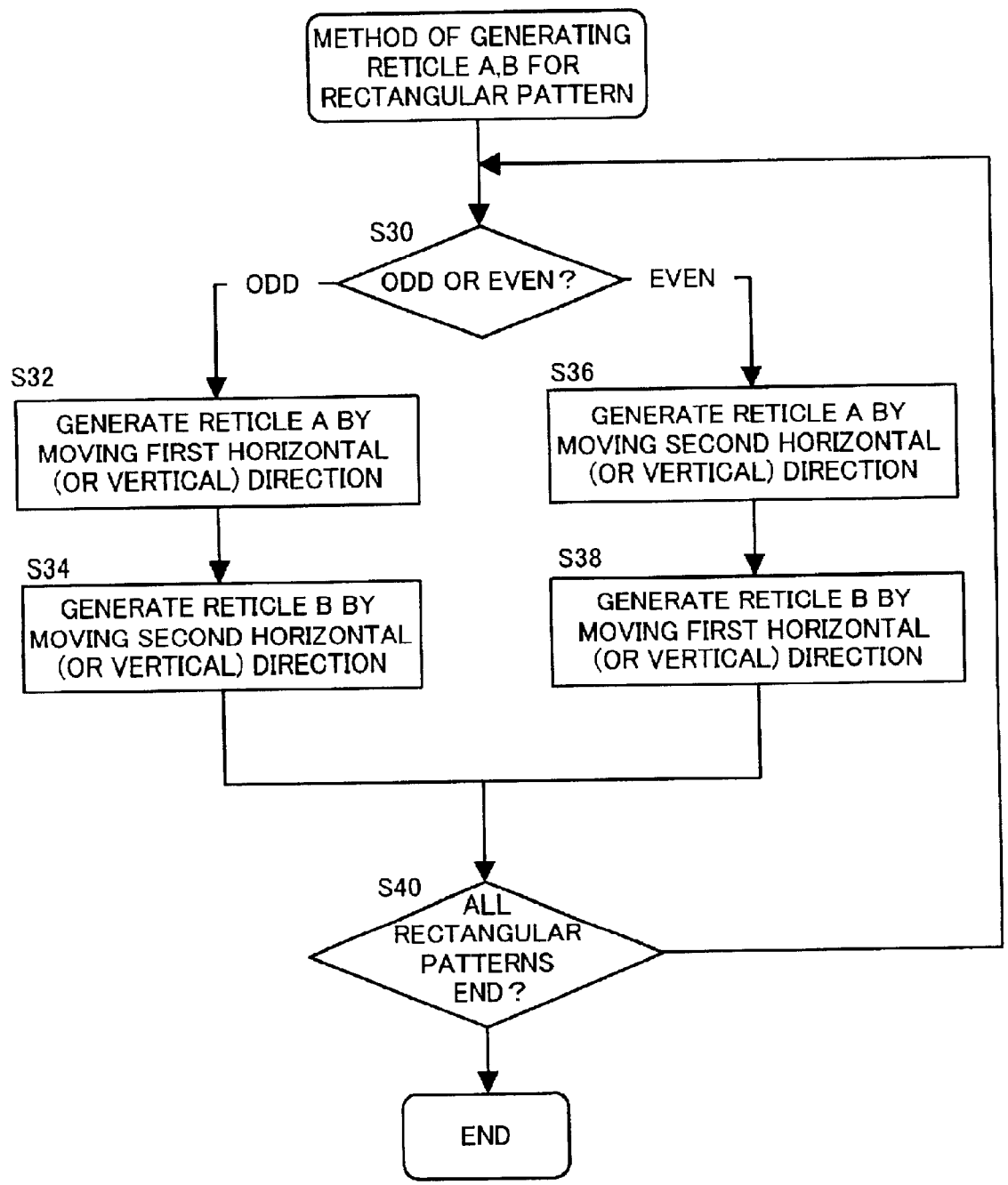
FIG. 15 is a flow chart depicting a method for generating reticles A and B with a rectangular pattern.

FIG. 15 is a flow chart depicting a method for generating reticles A and B with rectangular patterns. As FIG. 7 and FIG. 8 show, if a plurality of rectangular patterns are arranged in a horizontal direction or a vertical direction, the edge moving direction for generating the reticles A and B differs depending on whether the pattern has an odd number or an even number, which is detected in the pattern counting step S20.

As FIG. 15 shows, when the count value is an odd number (S30), the edges are moved to the first horizontal (or vertical) direction with respect to the rectangular pattern to generate the reticle A (S32). Also to generate the reticle B, the edges are moved to the second horizontal (or vertical) direction with respect to the same rectangular pattern (S34). When the count value is an even number, on the other hand, the direction of the edge movement is the opposite of the rectangular pattern with an odd number (S36, S38). The above processing is repeated until all the rectangular patterns end (S40).

Figure 16:
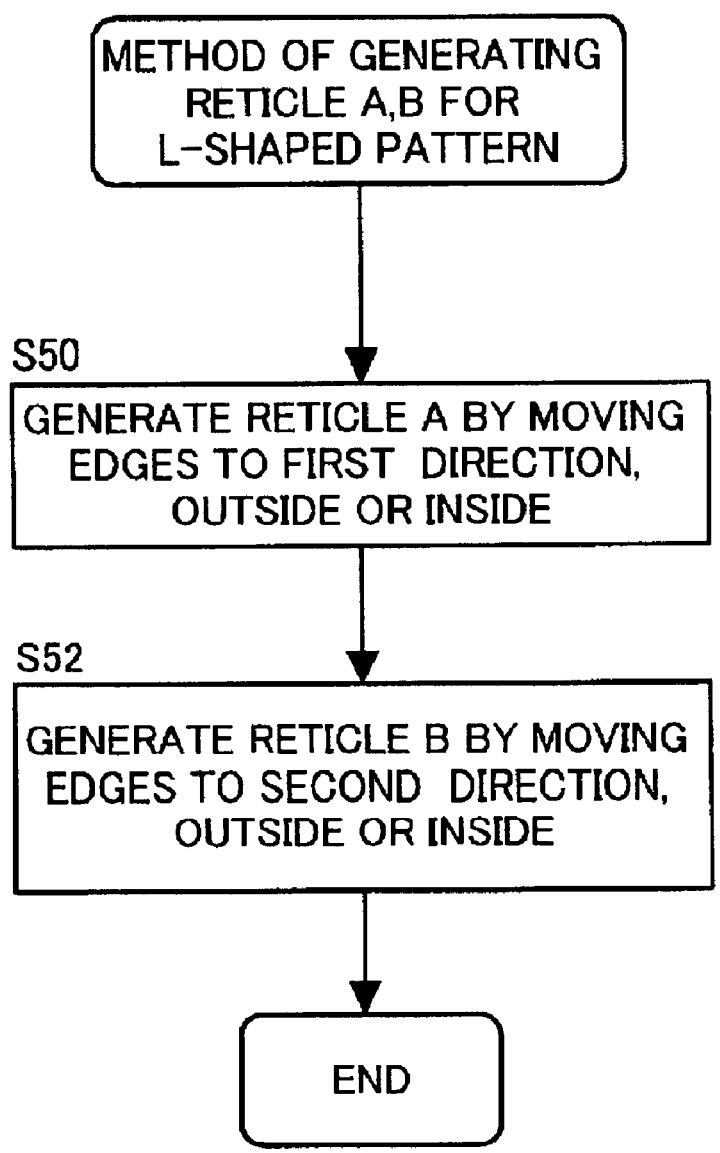
FIG. 16 is a flow chart depicting a method for generating reticles A and B with an L-shaped pattern.

FIG. 16 is a flow chart depicting a method for generating the reticles A and B with L-shaped patterns. As FIG. 9 shows, the pattern of the reticle A is generated by moving the edges to a first direction, either to the outside or inside of the L-shape, with respect to the two separated rectangular patterns constituting the L-shaped pattern (S50), then the pattern of the reticle B is generated by moving the edges to a second direction, which is the opposite of the first direction (S52).

Figure 17:
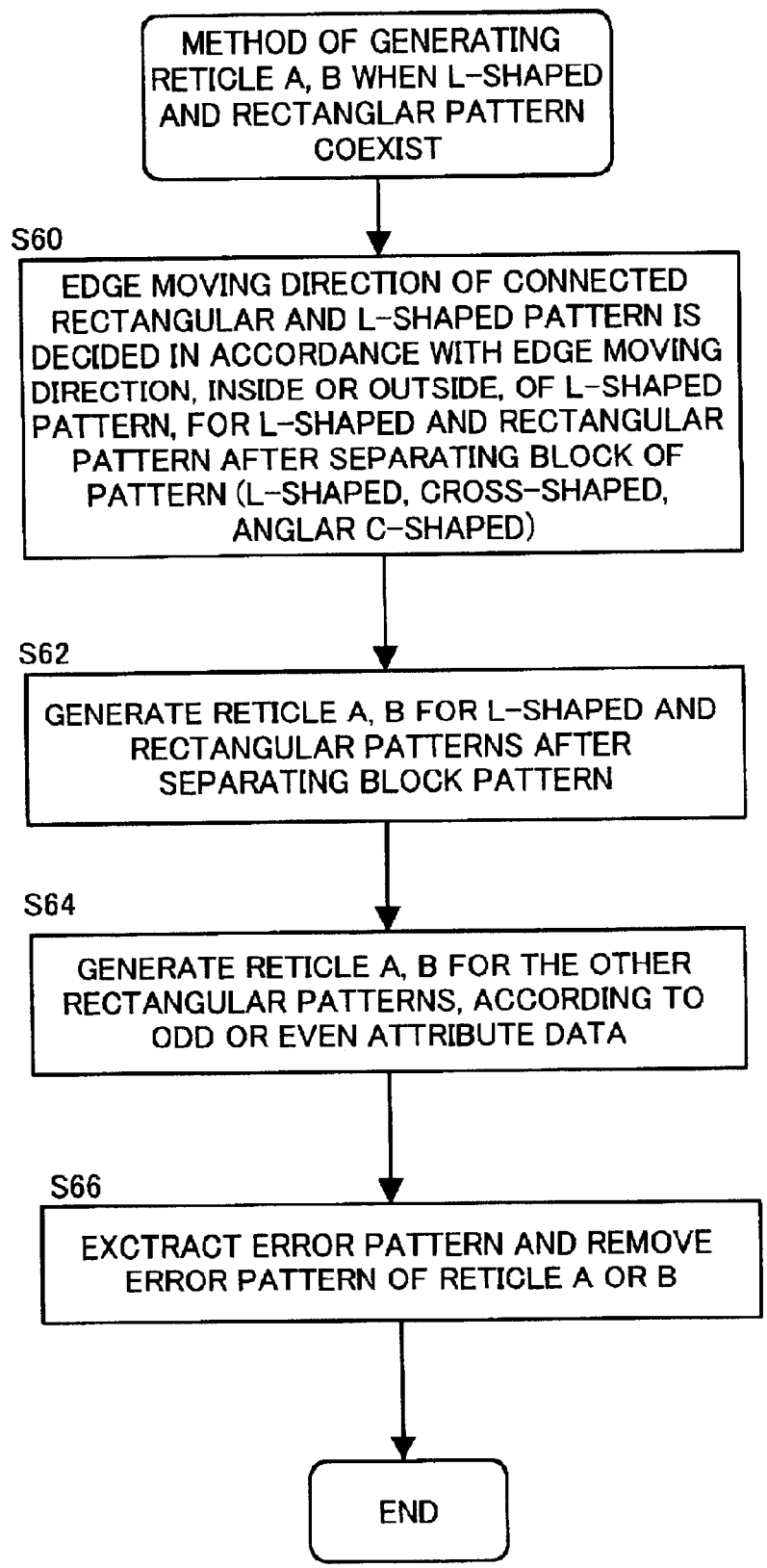
FIG. 17 is a flow chart depicting a method for generating reticles A and B when an L-shaped pattern and a rectangular pattern coexist in a pattern after separation.

FIG. 17 is a flow chart depicting a method for generating the reticles A and B when an L-shaped pattern and a rectangular pattern coexist in a pattern after separation. When an L-shaped pattern and a rectangular pattern coexist, the edge moving direction of the reticles A and B is decided for the L-shaped pattern and the rectangular pattern after the block pattern is separated. Since the separated pattern data is linked by block patterns, as shown in FIG. 14, the edge moving directions of the L-shaped pattern and the rectangular pattern connected thereto, after the block pattern is separated, are decided by the algorithm described in FIG. 12 (S60).

Based on this decision, the edges of the L-shaped pattern and the rectangular pattern, after the block pattern is separated, are moved for generating the reticles A and B (S62). As a result, the generation of an error pattern in the internal angle area is prevented for the L-shaped pattern, and the generation of an error pattern in the internal angle area between the L-shaped pattern and the rectangular pattern connected thereto is also prevented.

Assuming the case when the rectangular patterns constituting the L-shaped pattern are close to each other in the horizontal direction or the vertical direction, the edge moving direction may be decided according to the attribute data whether the rectangular pattern has an odd number or an even number.

For the other rectangular patterns, the edges are moved according to the attribute data on whether the pattern has an odd number or an even number to generate the patterns of the reticles A and B (S64). This method is as shown in FIG. 15.

With the above algorithm, the generation of an unexpected error pattern may not be completely prevented. To handle the generation of such an unexpected error pattern, an error pattern is extracted in the case of mixed patterns, and the error pattern is removed from the reticle A or B (S66). This error pattern removal step is the same as the error pattern removal step S26 in FIG. 13. Now the error pattern removal method will be described.

Figure 18A:
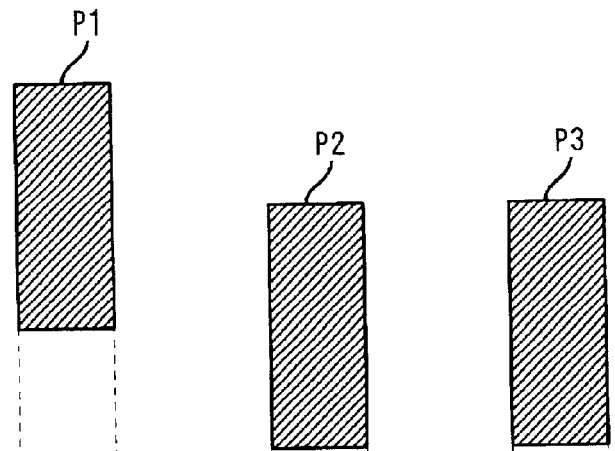
FIGS. 18A to 18C are diagrams depicting the generation of an error pattern.
Figure 18B:
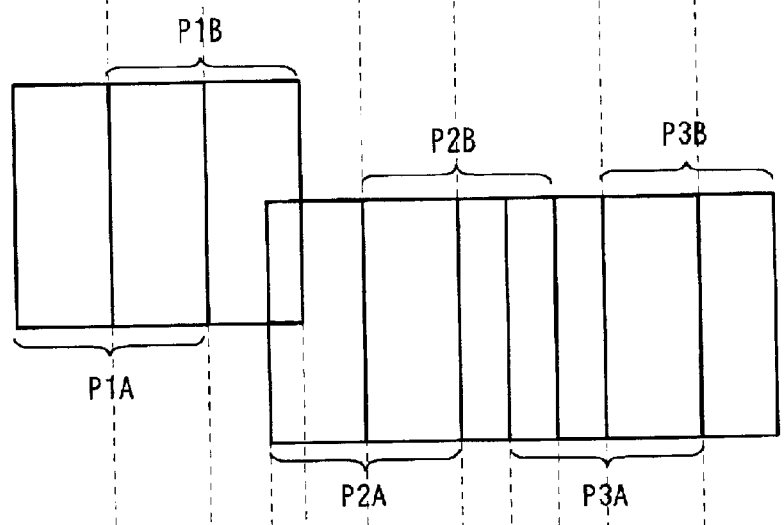
Figure 18C:
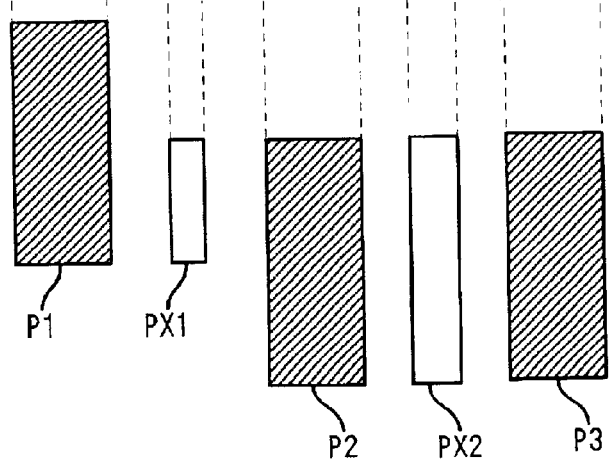

FIGS. 18A to 18C and FIGS. 19A to 19C are diagrams depicting an error pattern removal method. FIGS. 18A to 18C show examples when an error pattern is generated. As FIG. 18A shows, three patterns, P1, P2 and P3, are arranged close to each other. In this case, it is assumed that the pattern of the reticle A is generated by moving the left edges of the patterns P1, P2 and P3 to the left, and the pattern of the reticle B is generated by moving the right edges to the right respectively. To simplify description, an algorithm based on whether the pattern has an odd number or an even number is not used.

As a result, as FIG. 18B shows, the extended patterns P1A, P2A and P3A for the reticle A and the extended patterns P1B, P2B and P3B for the reticle B are generated for the respective pattern. Since the patterns P1, P2 and P3 are close to each other, the extended patterns P1B and P2A partially overlap, and the extended patterns P2B and P3A partially overlap. As a result, when lithography processing is performed using both reticles A and B, the error patterns PX1 and PX2 are generated, in addition to the original patterns P1, P2 and P3 shown in FIG. 18C.

Even when the patterns of the reticles A and B are created using the above mentioned algorithm, such an error pattern may be exceptionally generated in a complicated LSI pattern. So the present invention provides the following error pattern removal method to remove such an exceptionally generated error pattern.

Figure 19A:
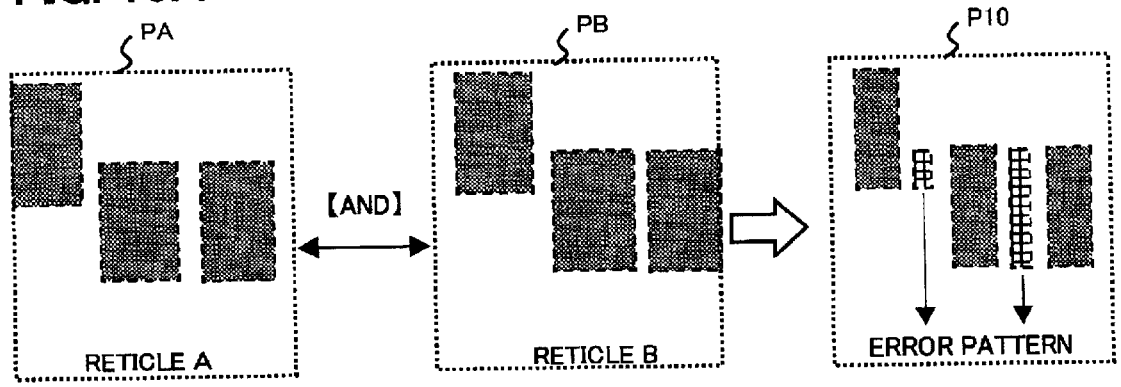
FIGS. 19A to 19C are diagrams depicting error pattern removal method in the present embodiment.

FIG. 19 shows an error pattern removal method. In this method, error patterns generated by the reticles A and B are extracted by data processing, and are removed from either the reticle A or B. As FIG. 19A shows, AND processing is performed on patterns PA and PB of the reticles A and B generated from original patterns, and the composite pattern P10, to be generated when lithography processing is executed using the reticles A and B, is generated. This composite pattern P10 includes error patterns.

Figure 19B:
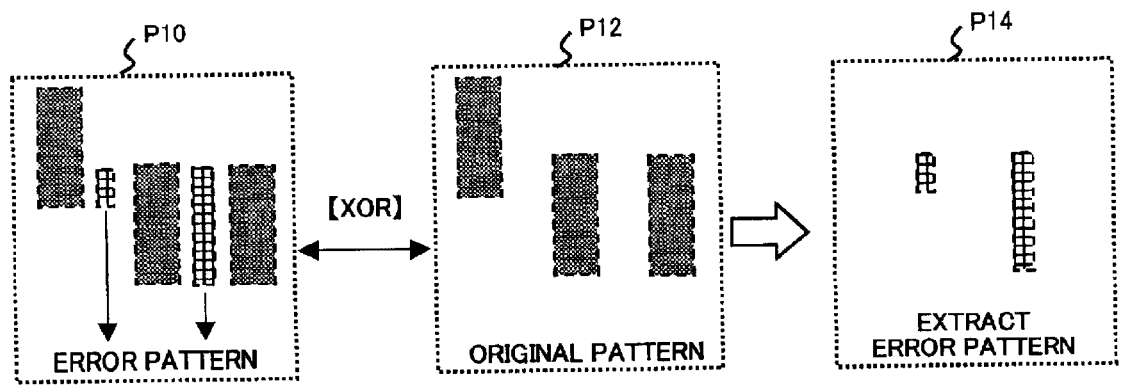
Figure 19C:
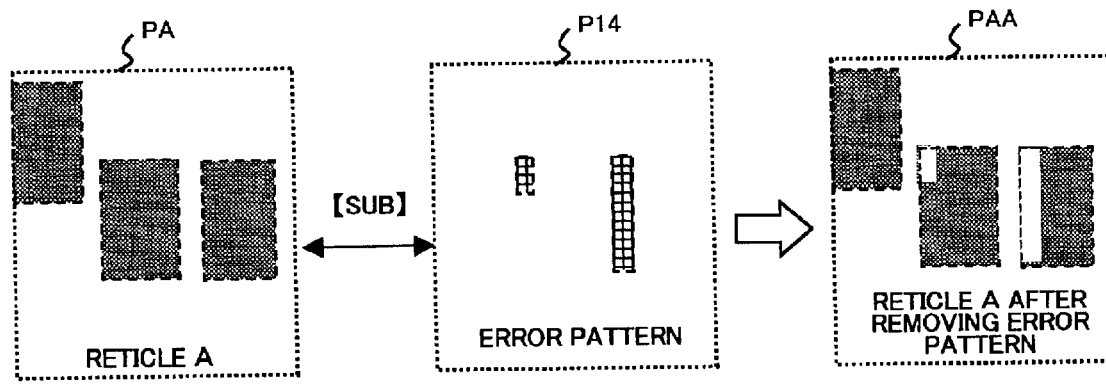

Then as FIG. 19B shows, exclusive OR processing is performed for the composite pattern P10 and the original pattern P12, and the mismatched area between both patterns is extracted. By this, only the error pattern P14 is extracted. And as FIG. 19C shows, subtraction processing to remove the error pattern P14 from the pattern PA of the reticle A is performed. The generation of an error pattern can be prevented by performing lithography processing using the pattern PAA of the reticle A and pattern PB of the reticle B, which are generated as the result. The above subtraction may remove the error pattern P14 from the pattern PB of the reticle B.

As FIGS. 13 and 17 show, the generation of an error pattern, which may be exceptionally generated, can be prevented by executing the error pattern removal steps (S26, S66) at the end.

Figure 20:
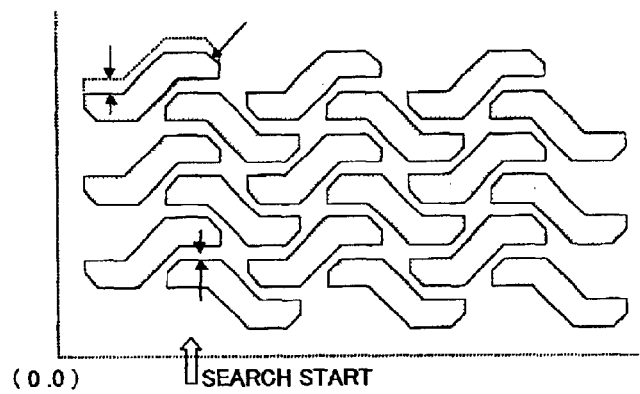
FIG. 20 are diagrams depicting a generation method for reticles A and B with diagonal patterns.
Figure 20:
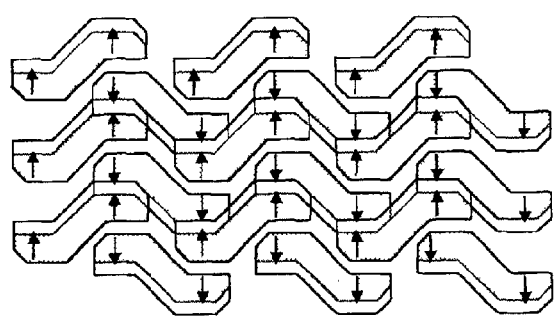
Figure 20:
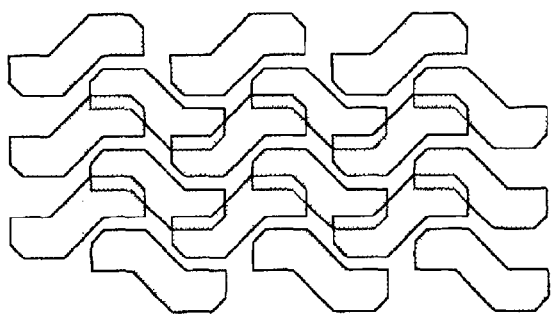
Figure 21:
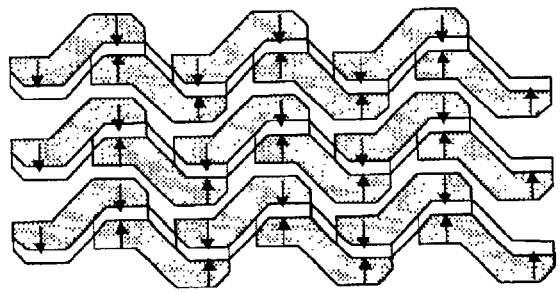
FIG. 21 are diagrams depicting a generation method for reticles A and B with diagonal patterns.
Figure 21:
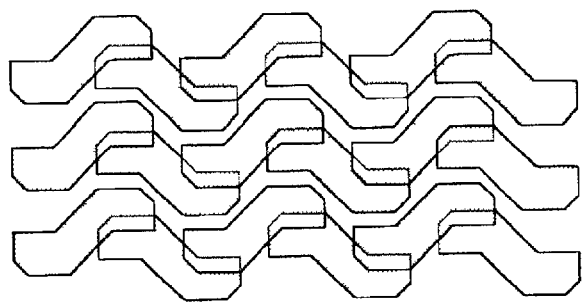
Figure 21:
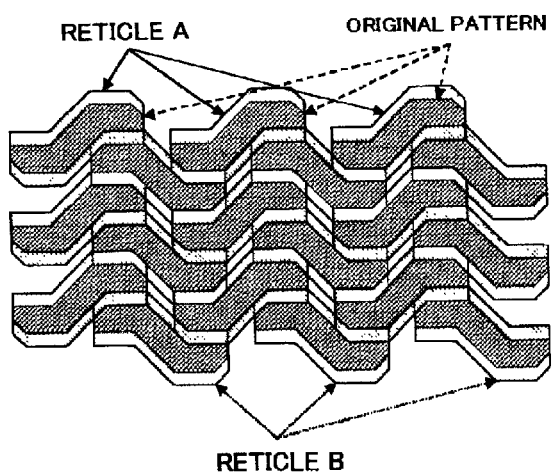

FIG. 20 and FIG. 21 are diagrams depicting a generation method for reticles A and B with diagonal patterns. FIG. 20 (1) shows the example of an original pattern where a plurality of diagonal patterns are repeatedly arranged. A memory cell area of an LSI often includes such a repeat pattern. The diagonal patterns are recognized as a diagonal block pattern in the above mentioned outline recognition step. And in the above mentioned search step, the diagonal patterns are recognized as diagonal patterns with an odd number or an even numbers, which are arranged in a vertical direction.

So the edge moving amount is set and the edge extending directions of the reticles A and B are decided according to the above mentioned algorithm where the edge moving direction of patterns with an odd number and with an even number are set to be opposite from each other.

As a result, as FIG. 20 (2) shows, the pattern of the reticle A is generated by moving the top edges of the diagonal patterns upward, or the bottom edges downward, depending on whether the pattern has an odd number or an even number. FIG. 20 (3) shows the pattern of the reticle A generated in this way. Since the edge moving direction is the opposite between an odd number and an even number, patterns partially overlap.

Also as FIG. 21 (1) shows, the pattern of the reticle B is generated by moving the edges to a direction opposite to that of reticle A. FIG. 21 (2) shows the generated pattern of the reticle B. In this case as well, patterns partially overlap.

And FIG. 21 (3) shows the composite pattern which is generated after executing lithography processing using the reticles A and B. Even if the patterns are slightly diagonal, the patterns of reticles A and B are generated just like horizontal rectangular patterns, by recognizing the odd pattern and the even pattern by moving the edges depending on this recognition. As a result, the generation of an error pattern is prevented, even if diagonal patterns are arranged close to each other.

In the semiconductor fabrication process, design data generated by computer design is pattern data with a predetermined format. Such pattern data is converted into exposure pattern data, which can be processed by an aligner with an electron beam or laser beam. This format conversion is performed by an exposure pattern generation system, where software for format conversion is installed on a general purpose computer. The aligner generates reticles and a photo masks according to the exposure pattern data after conversion. And using these reticles and photo masks, micro-patterns are created on semiconductor wafers by a stepper.

Figure 22:
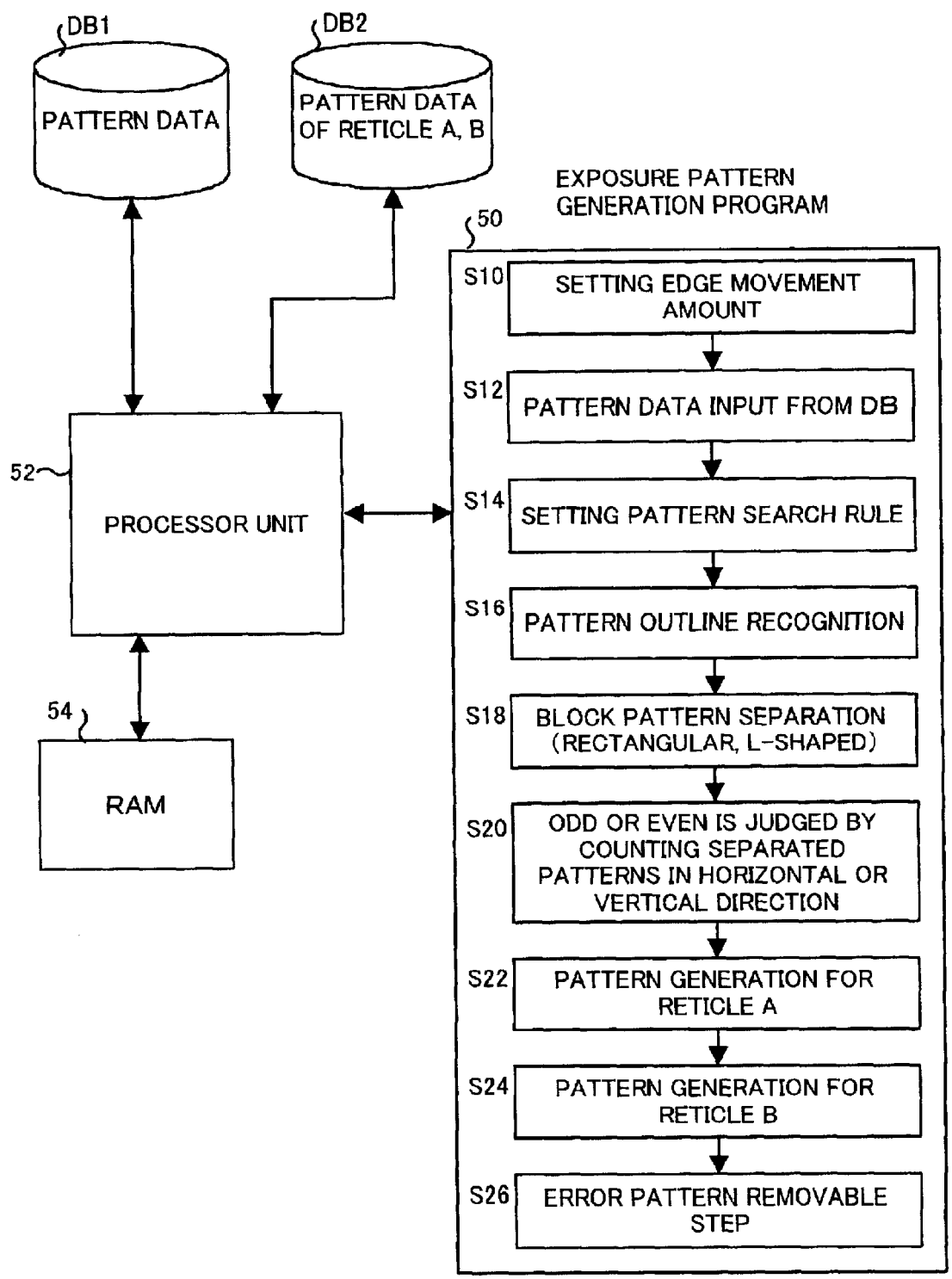
FIG. 22 are block diagrams depicting an exposure pattern generation system in the present embodiment.

FIG. 22 is a block diagram depicting an exposure pattern generation system of the present embodiment. This exposure pattern generation system is a dedicated system for exposure pattern generation, where an exposure pattern generation program 50 is installed on a general purpose computer system. Therefore the system is comprised of a processor unit 52, a RAM 54 for temporarily storing a program during operation or temporarily storing operation data, and a file 50 where the exposure pattern generation program is installed.

The generation of pattern data of the reticles A and B by the exposure pattern generation system is as described in FIG. 13. In other words, the pattern data DB1 generated from the design data is input, and the pattern outline recognition step S16, the block pattern separation step S18, the odd number and even number judgment step S20, which counts the separated patterns, the reticle A pattern generation step S22, the reticle B pattern generation step S24, and the error pattern removal step S26 are executed by the processor unit 52, which is a computer. Details of the pattern generation of each reticle is as described above.

According to the present invention, the generation of an error pattern in the composite pattern of the reticles A and B is prevented by appropriately controlling the edge moving directions of the original pattern for creating enlarged patterns of the reticle A and the reticle B.

What is claimed is:

1. A method of generating an exposure pattern for lithography to create a plurality of patterns arranged in a predetermined direction, comprising:

generating a first enlarged pattern using odd ones of the plurality of patterns by moving corresponding pattern edges of the odd ones of the plurality of patterns to a first direction along said predetermined direction, and using even ones of the plurality of patterns by moving corresponding pattern edges of the even ones of the plurality of patterns to a second direction, which is opposite to said first direction;

generating a second enlarged pattern using the odd ones of the plurality of patterns by moving the corresponding pattern edges of the odd ones of the plurality of patterns to said second direction and using the even ones of the plurality of patterns by moving the corresponding pattern edges of the even ones of the plurality of patterns to said first direction; and using said first and second enlarged patterns to create the plurality of patterns in a lithography operation using the respective enlarged patterns.

2. The method of generating the exposure pattern according to claim 1, wherein said predetermined direction is a horizontal direction when said plurality of patterns include elongated patterns extending in a vertical direction, and said predetermined direction is the vertical direction when said plurality of patterns include elongated patterns extending in the horizontal direction.

3. The method of generating the exposure pattern according to claim 1, wherein said predetermined direction is a direction along which said plurality of patterns are arranged when said plurality of patterns include elongated patterns extending in a diagonal direction.

4. A system of generating an exposure pattern for lithography to create a plurality of patterns arranged in a predetermined direction, comprising:

a first generation unit generating a first enlarged pattern using odd ones of the plurality of patterns by moving corresponding pattern edges of the odd ones of the plurality of patterns to a first direction along said predetermined direction, and using even ones of the plurality of patterns by moving corresponding pattern edges of the even ones of the plurality of patterns to a second direction, which is opposite to said first direction; and a second generation unit generating a second enlarged pattern using the odd ones of the plurality of patterns by moving the corresponding pattern edges of the odd ones of the plurality of patterns to said second direction and using the even ones of the plurality of patterns by moving pattern edges of the even ones of the plurality of patterns to said first direction;

wherein said first and second enlarged patterns are used to create the plurality of patterns in a lithography operation using the respective enlarged patterns.

5. A method of generating an exposure pattern for lithography to create an L-shaped pattern, comprising:

generating a first enlarged pattern by moving a pattern edge of said L-shaped pattern to an external angle direction of the L-shaped pattern; and generating a second enlarged pattern by moving said pattern edge to an internal angle direction of the L-shaped pattern, wherein said first and second enlarged patterns are used to create the L-shaped pattern in a lithography operation using the respective enlarged patterns.

6. A system of generating an exposure pattern for lithography to create an L-shaped pattern, comprising:

a first generation unit generating a first enlarged pattern by moving a pattern edge of said L-shaped pattern to an external angle direction of said L-shaped pattern; and a second generation unit generating a second enlarged pattern by moving said pattern edge to an internal angle direction of said L-shaped pattern, wherein said first and second enlarged patterns are used for creating the L-shaped pattern in a lithography operation using the respective enlarged patterns.

7. A method of generating an exposure pattern for lithography to create a cross-pattern, comprising:

separating said cross-pattern into an L-shaped pattern and another pattern;

generating a first enlarged pattern by moving an edge of said L-shaped pattern to an external angle direction of the L-shaped pattern and moving the edge of said another pattern, connected to said L-shaped pattern, to a direction opposite to said external angle direction; and generating a second enlarged pattern by moving the edge of said L-shaped pattern to an internal angle direction of the L-shaped pattern, and moving the edge of said another pattern, connected to said L-shaped pattern, to a direction opposite to said internal angle direction, wherein said first and second enlarged patterns are used to create the cross-pattern in a lithography operation using the respective enlarged patterns.

8. The method of generating the exposure pattern according to claim 7, wherein said cross-pattern includes a cross-shaped pattern or an angular C-shaped pattern, and said cross-shaped pattern or the angular C-shaped pattern is separated into the L-shaped pattern and a rectangular pattern connected thereto, and said another pattern is said rectangular pattern.

9. The method of generating the exposure pattern according to claim 7, wherein said cross-pattern has an F-shaped pattern, and said F-shaped pattern is separated into two L-shaped patterns and said another pattern is one of said two L-shaped patterns.

10. A system of generating an exposure pattern for lithography to create a cross-pattern, comprising:

a separation unit separating said cross-pattern into an L-shaped pattern and another pattern;

a first generation unit generating a first enlarged pastern by moving an edge of said L-shaped pattern to an external angle direction of the L-shaped pattern, and moving the edge of said another pattern, connected to said L-shaped pattern, to a direction opposite to said external angle direction; and a second generation unit generating a second enlarged pattern by moving the edge of said L-shaped pattern to an internal angle direction of the L-shaped pattern and moving the edge of said another pattern, connected to said L-shaped pattern, to a direction opposite to said internal angle direction, wherein said first and second enlarged patterns are used to create the cross-pattern in a lithography operation using the respective enlarged patterns.

11. A method of generating an exposure pattern for lithography to create a plurality of original patterns, comprising:

generating first enlarged patterns by moving edges of the original patterns to a first direction;

generating second enlarged patterns by moving the edges of said original patterns to a second direction, opposite of the first direction;

executing an AND processing of said first and second enlarged patterns to generate AND patterns having an area where corresponding first and second enlarged patterns overlap;

executing an exclusive OR processing of said original patterns and the AND patterns to generate exclusive patterns having exclusive areas of the original patterns and the AND patterns, respectively; and generating new first enlarged patterns by removing said exclusive patterns from said first enlarged patterns.

12. The method of generating the exposure pattern according to claim 11, wherein said plurality of original patterns are arranged in a predetermined direction, said generating of the first enlarged patterns comprises moving pattern edges to one direction along said predetermined direction for odd patterns among said plurality of original patterns and moving the pattern edge to the other direction, opposite to said one direction, for even patterns among said plurality of original patterns, and said generating of the second enlarged patterns comprises moving the pattern edges to said other direction for said odd patterns, and moving the pattern edges to said one direction for said even patterns.

13. The method of generating the exposure pattern according to claim 11, wherein said original patterns include L-shaped patterns, said generating said first enlarged patterns comprises moving pattern edges of said L-shaped patterns to an external angle direction of the L-shaped patterns, and said step of generating said second enlarged patterns comprises moving said pattern edges to an internal angle direction of the L-shaped patterns.

14. The method of generating the exposure pattern according to claim 11, wherein said original patterns include cross patterns, said cross patterns being separated into a corresponding L-shaped pattern and another pattern before the generation of the first and second enlarged patterns, said generating of each of said first enlarged pattern comprise moving an edge of said L-shaped pattern to an external angle direction of the L-shaped pattern and moving the edge of said another pattern connected to said L-shaped pattern to a direction opposite to said external angle direction, and said generating of each of said second enlarged pattern comprise moving the edge of said L-shaped pattern to an internal angle direction of the L-shaped pattern and moving the edge of said another pattern connected to said L-shaped pattern to a direction opposite to said internal angle direction.

15. A system of generating an exposure pattern for lithography to create a plurality of original patterns, comprising:

a first generation unit generating first enlarged patterns by moving edges of the original patterns to a first direction;

a second generation unit generating second enlarged patterns by moving the edges of said original patterns to a second direction, opposite of the first direction;

an AND processing unit executing an AND processing of said first and second enlarged patterns to generate an AND patterns having an area where corresponding first and second enlarged patterns overlap;

an exclusive processing unit executing an exclusive OR processing of said original patterns and the AND patterns to generate exclusive patterns having exclusive areas of the original patterns and the AND patterns, respectively; and a removal processing unit generating new first enlarged patterns by removing said exclusive patterns from said first enlarged patterns.

16. A manufacturing method for a semiconductor device having a plurality of patterns arranged in a predetermined direction, comprising:

generating a first enlarged pattern using odd ones of the plurality of patterns by moving corresponding pattern edges of the odd ones of the plurality of patterns to a first direction along said predetermined direction, and using even ones of the plurality of patterns by moving corresponding pattern edges of the even ones of the plurality of patterns to a second direction, opposite to said first direction;

generating a second enlarged pattern using the odd ones of the plurality of patterns by moving the corresponding pattern edges of the odd ones of the plurality of patterns to said second direction, and using the even ones of the plurality of patterns by moving the corresponding pattern edges of the even ones of the plurality of patterns to said first direction; and creating patterns corresponding to said plurality of patterns on a substrate by performing exposure, development, and etching on a patterning target layer and a resist layer on said substrate using a first reticle having said first enlarged pattern and a second reticle having said second enlarged pattern, respectively.

17. A manufacturing method for a semiconductor device having an L-shaped pattern, comprising:

generating a first enlarged pattern by moving an edge of said L-shaped pattern to an external angle direction of the L-shaped pattern;

generating a second enlarged pattern by moving said edge to an internal angle direction of the L-shaped pattern; and creating a pattern corresponding to said L-shaped pattern on a substrate by performing exposure, development, and etching on a patterning target layer and a resist layer on said substrate using a first reticle having said first enlarged pattern and a second reticle having said second enlarged pattern, respectively.

18. A manufacturing method for a semiconductor device having a cross-pattern, comprising:

separating said cross-pattern into an L-shaped pattern and another pattern;

generating a first enlarged pattern by moving an edge of said L-shaped pattern to an external angle direction of the L-shaped pattern, and moving the edge of said another pattern, connected to said L-shaped pattern, to a direction opposite to said external angle direction; and generating a second enlarged pattern by moving the edge of said L-shaped pattern to an internal angle direction of the L-shaped pattern, and moving the edge of said another pattern, connected to said L-shaped pattern, to a direction opposite to said internal angle direction; and creating a pattern corresponding to said cross-pattern on a substrate by performing exposure, development, and etching on a patterning target layer and a resist layer on said substrate using a first reticle having said first enlarged pattern and a second reticle having said second enlarged pattern, respectively.

* * * * *

UNITED STATES PATENT AND TRADEMARK OFFICE
CERTIFICATE OF CORRECTION

PATENT NO. : 6,800,428 B2
DATED : October 5, 2004
INVENTOR(S) : Tomoyuki Okada et al.

It is certified that error appears in the above-identified patent and that said Letters Patent is hereby corrected as shown below:

Column 16,
Line 38, change "pastern" to -- pattern --.

Column 17,
Line 56, delete "an".

Signed and Sealed this

Tenth Day of May, 2005

JON W. DUDAS
*Director of the United States Patent and Trademark Office*